United States Patent
Ikenaga et al.

(10) Patent No.: US 9,761,747 B2
(45) Date of Patent: Sep. 12, 2017

(54) ENCAPSULATING MATERIAL FOR SOLAR CELL AND SOLAR CELL MODULE

(71) Applicant: Mitsui Chemicals Tohcello, Inc., Chiyoda-ku, Tokyo (JP)

(72) Inventors: Shigenobu Ikenaga, Chiba (JP); Fumito Takeuchi, Chiba (JP); Tomoaki Ito, Ichihara (JP); Kazuhiro Yarimizu, Fujisawa (JP); Kaoru Ohshimizu, Ichihara (JP); Masaaki Odoi, Hitachinaka (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 14/646,499

(22) PCT Filed: Nov. 18, 2013

(86) PCT No.: PCT/JP2013/080998
§ 371 (c)(1),
(2) Date: May 21, 2015

(87) PCT Pub. No.: WO2014/080856
PCT Pub. Date: May 30, 2014

(65) Prior Publication Data
US 2015/0303340 A1 Oct. 22, 2015

(30) Foreign Application Priority Data

Nov. 21, 2012 (JP) ................................ 2012-255278
Dec. 21, 2012 (JP) ................................ 2012-278975
Mar. 13, 2013 (JP) ................................ 2013-050382

(51) Int. Cl.
*H01L 31/048* (2014.01)
*C08L 23/08* (2006.01)
*C08K 5/14* (2006.01)
*C08K 3/00* (2006.01)
*C08K 5/00* (2006.01)

(52) U.S. Cl.
CPC ............ *H01L 31/0481* (2013.01); *C08K 5/14* (2013.01); *C08L 23/0807* (2013.01); *C08K 3/0033* (2013.01); *C08K 5/0041* (2013.01); *Y02E 10/50* (2013.01)

(58) Field of Classification Search
CPC .................................................. H01L 31/0481
See application file for complete search history.

(56) References Cited

U.S. PATENT DOCUMENTS 9,040,811 B2* 5/2015 Ikenaga .............. H01L 31/0481
136/251
2007/0251572 A1 11/2007 Hoya et al.
2007/0267059 A1* 11/2007 Nishijima ................ C08L 23/02
136/256
2009/0288701 A1 11/2009 Hayes et al.
2011/0061735 A1* 3/2011 Nishijima .............. C08F 210/02
136/259
2011/0168262 A1 7/2011 Sakojiri
2012/0000514 A1 1/2012 Amamiya et al.
2012/0073631 A1 3/2012 Ikenaga et al.
2013/0137833 A1 5/2013 Amamiya et al.
2013/0213471 A1* 8/2013 Ikenaga ................ C08F 210/16
136/256

FOREIGN PATENT DOCUMENTS

| CN | 102365754 A | 2/2012 |
|----|----|----|
| CN | 102627803 A | 8/2012 |
| EP | 2586822 A1 | 5/2013 |
| EP | 2747150 A1 | 6/2014 |
| JP | 2006-210906 A | 8/2006 |
| JP | 2008-115344 A | 5/2008 |
| JP | 2010-053298 A | 3/2010 |
| JP | 2011-521478 A | 7/2011 |
| JP | 2011-171321 A | 9/2011 |
| JP | 2013-041974 A | 2/2013 |
| TW | 201043641 A1 | 12/2010 |

(Continued)

OTHER PUBLICATIONS

TAFMER A4070 flyer, 2011.*
TAFMER A4085 flyer, 2011.*
TAFMER DF710 flyer, 2011.*
International Search Report (PCT/ISA/210) mailed on Feb. 18, 2014, by the Japanese Patent Office as the International Searching Authority for International Application No. PCT/JP2013/080998.
Written Opinion (PCT/ISA/237) mailed on Feb. 18, 2014, by the Japanese Patent Office as the International Searching Authority for International Application No. PCT/JP2013/080998.
Office Action issued by the Chinese Patent Office in corresponding Chinese Patent Application No. 201380060204.8 on Mar. 31, 2016 (10 pages).
Notification of Reasons for Refusal issued by the Korean Patent Office in corresponding Korean Patent Application No. 10-2015-7012853 on Oct. 10, 2016 (12 pages with partial English translation).

(Continued)

*Primary Examiner* — Irina Krylova
(74) *Attorney, Agent, or Firm* — Buchanan, Ingersoll & Rooney PC

(57) ABSTRACT

The encapsulating material for solar cell is an encapsulating material for solar cell including an ethylene/α-olefin copolymer and an organic peroxide having a one-minute half-life temperature in a range of 100° C. to 170° C. In addition, the complex viscosity of the encapsulating material for solar cell has the minimum value ($\eta^{*1}$) of the complex viscosity at a temperature in a range of 100° C. to lower than 135° C., the minimum value ($\eta^{*1}$) of the complex viscosity is in a range of $6.0\times10^3$ Pa·s to $4.0\times10^4$ Pa·s, the complex viscosity ($\eta^{*2}$) of the encapsulating material for solar cell at 150° C. is in a range of $2.0\times10^4$ Pa·s to $1.0\times10^5$ Pa·s, and the content of the organic peroxide in the encapsulating material for solar cell is in a range of 0.1 parts by weight to 3 parts by weight with respect to 100 parts by weight of the ethylene/α-olefin copolymer.

7 Claims, 2 Drawing Sheets

(56) References Cited

FOREIGN PATENT DOCUMENTS

| TW | 201221528 A1 | 6/2012 |
|----|--------------|--------|
| WO | WO 2011/162324 A1 | 12/2011 |
| WO | WO 2012/060086 A1 | 5/2012 |

OTHER PUBLICATIONS

Extended Search Report issued by the European Patent Office in corresponding European Patent Application No. 13857078.3 on May 19, 2016 (8 pages).

\* cited by examiner

ENCAPSULATING MATERIAL FOR SOLAR CELL AND SOLAR CELL MODULE

TECHNICAL FIELD

The present invention relates to an encapsulating material for solar cell and a solar cell module.

BACKGROUND ART

In response to the increasing seriousness of global environmental issues, energy issues and the like, a solar cell is attracting attention as clean electric energy-generating means with no concern over depletion. In a case in which a solar cell is used outdoors such as on the roof of a building, it is usual to use the solar cell in a solar cell module form.

Generally, the solar cell module is manufactured in the following order. First, a crystalline solar cell element (hereinafter, in some cases, also referred to as a power generation element or a cell) formed of polycrystalline silicon or monocrystalline silicon, or a thin film-type solar cell element obtained by forming an extremely thin (several micrometers) film of amorphous silicon or crystal silicon on a glass substrate or the like is manufactured. Next, in order to obtain a crystalline solar cell module, a protective sheet (a transparent surface protective member) for the solar cell module, an encapsulating material for solar cell, the crystalline solar cell element, an encapsulating material for solar cell, and a protective sheet (a back surface protective member) for the solar cell module are sequentially laminated.

Meanwhile, in order to obtain a thin film-based solar cell module, a thin film-type solar cell element, an encapsulating material for solar cell, and a protective sheet (a back surface protective member) for the solar cell module are sequentially laminated.

After that, the solar cell module is manufactured using a lamination method or the like in which the above-described laminate is suctioned in a vacuum, heated and pressed. The solar cell module manufactured in the above-described manner is weather resistant and is also suitable for outdoor use such as on the roof of a building.

An ethylene/vinyl acetate (EVA) copolymer film is widely used as an encapsulating material for solar cell due to its excellent transparency, flexibility, adhesiveness and the like. For example, Patent Document 1 discloses an encapsulating film which is made of an EVA composition including a crosslinking agent and trimellitate ester and is excellent in terms of both adhesiveness and film-forming properties. However, in a case in which the EVA composition is used as a configuration material of an encapsulating material for solar cell, there has been a concern that components such as acetic acid gas generated from the decomposition of EVA may adversely affect a solar cell element.

Meanwhile, the use of a polyolefin-based material, particularly a polyethylene-based material, as an encapsulating material for solar cell has been proposed due to its excellent insulating properties (for example, refer to Patent Document 2).

In addition, a resin composition for an encapsulating material for solar cell in which an ethylene/α-olefin copolymer, which is crosslinked within a relatively short period of time and thus has a sufficient adhering force and has excellent balance between stiffness and crosslinking characteristics, is used has also been proposed (for example, refer to Patent Document 3).

RELATED DOCUMENT

Patent Document

[Patent Document 1] Japanese Unexamined Patent Publication No. 2010-53298
[Patent Document 2] Japanese Unexamined Patent Publication No. 2006-210906
[Patent Document 3] International Publication No. WO2011/162324

DISCLOSURE OF THE INVENTION

According to the present inventors' studies, it has been clarified that, in some cases, an encapsulating material of the prior art causes disadvantages such as the contamination of a polytetrafluoroethylene (PTFE) sheet or an oven in a laminator. In addition, it has been clarified that, furthermore, a resin composition for an encapsulating material for solar cell made of an ethylene/α-olefin copolymer described in Patent Document 3 has room for improvement in terms of long-term reliability.

As a method for manufacturing a solar cell module, for example, a method in which a pair of encapsulating materials sandwiching a solar cell is sandwiched using a pair of protective members, heated, and laminated is widely employed. However, in this manufacturing method, there have been cases in which the encapsulating material on the back side of the solar cell is pressed and sneaks into the front side of the solar cell. This phenomenon has had a possibility that, in a case in which the encapsulating material on the back side of the solar cell is colored, the sneaking of the encapsulating material on the back side into the front side of the solar cell does not only affect the yield of a solar cell module but also blocks light incident on the solar cell, consequently, the solar cell is hindered in exhibition of the intrinsic power generation performance or heat is locally generated in a light blocking portion, and thus there is a problem in that material deterioration or the deterioration of the solar cell is accelerated.

Therefore, an object of the present invention is to provide an encapsulating material for solar cell which is capable of suppressing the leakage and sneaking (in the case of a colored encapsulating material for a back surface) of the encapsulating material for solar cell and the contamination of a manufacturing apparatus during the manufacturing of a solar cell module, furthermore, suppresses the cracking of solar cell elements, and also has excellent long-term reliability.

As a result of intensive studies to achieve the above-described object, the present inventors found that the above-described disadvantages are suppressed by appropriately controlling the complex viscosity of the encapsulating material for solar cell and the present inventors completed the present invention.

That is, according to the present invention, an encapsulating material for solar cell and a solar cell module described below are provided.

[1] An encapsulating material for solar cell including:
an ethylene/α-olefin copolymer; and
an organic peroxide having a one-minute half-life temperature in a range of 100° C. to 170° C.,
in which a complex viscosity of the encapsulating material for solar cell, which is measured through solid viscoelasticity measurement under conditions of a measurement temperature range of 25° C. to 150° C., a frequency of 1.0 Hz, a rate of temperature increase of 10° C./minute, and a shear mode, has a minimum value ($\eta^{*1}$) of the complex viscosity at a temperature in a range of 100° C. to lower than 135° C., the minimum value ($\eta^{*1}$) of the complex viscosity is in a range of $6.0 \times 10^3$ Pa·s to $4.0 \times 10^4$ Pa·s, the complex viscosity ($\eta^{*2}$) of the encapsulating material for solar cell at 150° C. is in a range of $2.0 \times 10^4$ Pa·s to $1.0 \times 10^5$ Pa·s, and a content of the organic peroxide in the encapsulating material for solar cell is in a range of 0.1 parts by weight to 3 parts by weight with respect to 100 parts by weight of the ethylene/α-olefin copolymer.

[2] The encapsulating material for solar cell according to [1], in which a storage elastic modulus (G') of the encapsulating material for solar cell at 150° C., which is measured through solid viscoelasticity measurement under conditions of a measurement temperature range of 25° C. to 150° C., a frequency of 1.0 Hz, a rate of temperature increase of 10° C./minute, and a shear mode, is in a range of $1.0 \times 10^5$ Pa to $7.0 \times 10^5$ Pa.

[3] The encapsulating material for solar cell according to [1] or [2], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol % (here, a sum of the structural unit derived from ethylene and the structural unit derived from the α-olefin is 100 mol %);

a2) MFR, which is based on ASTM D1238 and measured under conditions of a temperature of 190° C. and a load of 2.16 kg, is in a range of 0.1 g/10 minutes to 8.0 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[4] The encapsulating material for solar cell according to any one of [1] to [3], in which the encapsulating material has a sheet shape.

[5] The encapsulating material for solar cell according to any one of [1] to [4], in which, in a long-term reliability test in which a crosslinked sheet obtained from a sheet-shaped encapsulating material for solar cell cut into sizes of a thickness of 0.5 mm, a length of 75 mm, and a width of 60 mm which has been depressurized for 3 minutes and heated for 10 minutes on a hot plate at 150° C. is left to stand in a constant temperature and humidity vessel having a temperature of 85° C. and a relative humidity of 85% for 2000 hours, when a yellow index of the crosslinked sheet before the long-term reliability test is represented by $YI_1$, and the yellow index of the crosslinked sheet after the long-term reliability test is represented by $YI_2$, a change ratio of the yellow index defined as ($YI_2-YI_1$) is less than 2.

[6] An encapsulating material for a back surface of a solar cell including:

an ethylene/α-olefin copolymer;

a colorant; and an organic peroxide having a one-minute half-life temperature in a range of 100° C. to 170° C., in which the encapsulating material is used on a non-light-receiving surface side, a content of the organic peroxide in the encapsulating material for a back surface of a solar cell is in a range of 0.1 parts by weight to 3 parts by weight with respect to 100 parts by weight of the ethylene/α-olefin copolymer, a content of the colorant in the encapsulating material for a back surface of a solar cell is in a range of 1 part by weight to 30 parts by weight with respect to 100 parts by weight of the ethylene/α-olefin copolymer, a minimum value ($\eta^{*3}$) of a complex viscosity of the encapsulating material for a back surface of a solar cell, which is measured through solid viscoelasticity measurement under conditions of a measurement temperature range of 25° C. to 180° C., a frequency of 0.016 Hz, a rate of temperature increase of 3° C./minute, and a shear mode, is in a range of $4.0 \times 10^3$ Pa·s to $1.0 \times 10^6$ Pa·s.

[7] The encapsulating material for a back surface of a solar cell according to [6], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol % (here, a sum of the structural unit derived from ethylene and the structural unit derived from the α-olefin is 100 mol %);

a2) MFR, which is based on ASTM D1238 and measured under conditions of a temperature of 190° C. and a load of 2.16 kg, is in a range of 0.1 g/10 minutes to 8.0 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[8] The encapsulating material for a back surface of a solar cell according to [6] or [7], in which the colorant is at least one selected from a group consisting of organic pigments, dyes, and inorganic fillers.

[9] The encapsulating material for a back surface of a solar cell according to any one of [6] to [8], in which the colorant includes an inorganic filler, and the inorganic filler is at least one selected from a group consisting of natural mica, synthetic mica, titanium oxide, aluminum oxide, calcium carbonate, talc, clay, magnesium carbonate, kaolinite, and diatomite.

[10] The encapsulating material for a back surface of a solar cell according to [9], in which a content of an acidic compound in the encapsulating material for a back surface of a solar cell is equal to or less than 8 weight ppm.

[11] A solar cell module including:

a transparent surface protective member;

a back surface protective member;

a solar cell element; and an encapsulating layer which is formed by crosslinking the encapsulating material for solar cell according to any one of [1] to [5] and encapsulates the solar cell element between the transparent surface protective member and the back surface protective member.

[12] A solar cell module including:

a transparent surface protective member;

a back surface protective member;

a solar cell element; and an encapsulating layer that encapsulates the solar cell element between the transparent surface protective member and the back surface protective member, in which the encapsulating layer is formed by heating and pressing the encapsulating material for a back surface of a solar cell according to anyone of [6] to [10] and an encapsulating material for a front surface of a solar cell.

[13] The solar cell module according to [12],
in which a minimum value ($\eta^{*3}$) of a complex viscosity of the encapsulating material for a back surface of a solar cell, which is measured through solid viscoelasticity measurement under conditions of a measurement temperature range of 25° C. to 180° C., a frequency of 0.016 Hz, a rate of temperature increase of 3° C./minute, and a shear mode, and a minimum value ($\eta^{*0}$) of a complex viscosity of the encapsulating material for a front surface of a solar cell, which is measured under the same conditions, satisfy the following relationship:

$$-2.0 \leq Log(\eta^{*3}/\eta^{*0}) \leq 3.0.$$

According to the present invention, it is possible to provide an encapsulating material for solar cell in which the leakage and sneaking (in the case of a colored encapsulating material for a back surface) of the encapsulating material for solar cell and the contamination of a manufacturing apparatus during the manufacturing of the solar cell module can be suppressed by appropriately controlling the complex viscosity of the encapsulating material for solar cell, furthermore, the cracking of solar cell elements is suppressed, and the long-term reliability is also excellent.

BRIEF DESCRIPTION OF THE DRAWINGS

The above-described object, other objects, characteristics, and advantages will be further clarified using preferable embodiments described below and the following drawings accompanied by the present embodiments.

DESCRIPTION OF EMBODIMENTS

Figure 1:
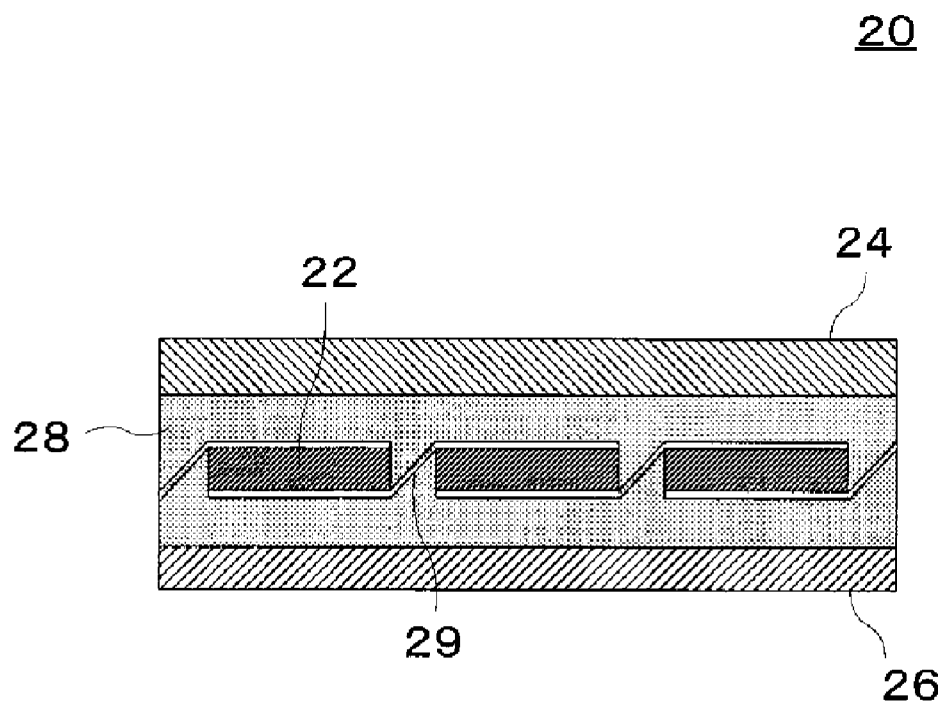
FIG. 1 is a cross-sectional view schematically illustrating an embodiment of a solar cell module of the present invention.

Hereinafter, embodiments of the present invention will be described. Encapsulating materials for solar cell of the present embodiment are an encapsulating material for solar cell (I) used as both an encapsulating material for a front surface (light-receiving surface) and an encapsulating material for a back surface (non-light-receiving surface) of a solar cell module and a colored encapsulating material for solar cell (II) exclusively used as an encapsulating material for a back surface. The encapsulating material for solar cell (I) and the encapsulating material for solar cell (II) are basically the same as each other in terms of the configuration components and the method for manufacturing the encapsulating material except for the fact that the encapsulating material for solar cell (II) includes a specific colorant. Hereinafter, the encapsulating material for solar cell (I) and the encapsulating material for solar cell (II) will be described. In the following description, in some cases, the encapsulating material for solar cell (II) will also be referred to as the "encapsulating material for a back surface of a solar cell". In addition, reference signs "a to b" indicating a numerical range indicate "equal to or more than a and equal to or less than b" unless particularly otherwise described.

1. Regarding Encapsulating Material for Solar Cell (I)

The encapsulating material for solar cell (I) of the present embodiment includes, as essential components, an ethylene/α-olefin copolymer and an organic peroxide having a one-minute half-life temperature in a range of 100° C. to 170° C. The content of the organic peroxide in the encapsulating material for solar cell (I) is in a range of 0.1 parts by weight to 3 parts by weight with respect to 100 parts by weight of the ethylene/α-olefin copolymer.

In the encapsulating material for solar cell (I) of the present embodiment, when the solid viscoelasticity is measured in a measurement temperature range of 25° C. to 150° C. at a frequency of 1.0 Hz and a rate of temperature increase of 10° C./minute in a shear mode, the minimum value ($\eta^{*1}$) of the complex viscosity is present at a temperature in a range of 100° C. to lower than 135° C. and the minimum value ($\eta^{*1}$) falls in a range of $6.0 \times 10^3$ Pa·s to $4.0 \times 10^4$ Pa·s. The lower limit value of the minimum value ($\eta^{*1}$) is preferably equal to or more than $7.0 \times 10^3$ Pa·s, and the upper limit value of the minimum value ($\eta^{*1}$) is preferably equal to or less than $3.0 \times 10^4$ Pa·s.

The encapsulating material for solar cell (I) of the present embodiment has a complex viscosity ($\eta^{*2}$) of the encapsulating material for solar cell (I) at 150° C. which is in a range of $2.0 \times 10^4$ Pa·s to $1.0 \times 10^5$ Pa·s after the solid viscoelasticity is measured in a measurement temperature range of 25° C. to 150° C. at a frequency of 1.0 Hz and a rate of temperature increase of 10° C./minute in a shear mode. The lower limit value of the complex viscosity ($\eta^{*2}$) is preferably equal to or more than $4.0 \times 10^4$ Pa·s and more preferably equal to or more than $4.5 \times 10^4$ Pa·s.

The encapsulating material for solar cell (I) of the present embodiment preferably further satisfies the following requirement. The storage elastic modulus (G') of the encapsulating material for solar cell (I) at 150° C. is preferably in a range of $1.0 \times 10^5$ Pa to $7.0 \times 10^5$ Pa after the solid viscoelasticity is measured in a measurement temperature range of 25° C. to 150° C. at a frequency of 1.0 Hz and a rate of temperature increase of 10° C./minute in a shear mode. The lower limit value of the storage elastic modulus (G') is more preferably equal to or more than $2.5 \times 10^5$ Pa and still more preferably equal to or more than $3.0 \times 10^5$ Pa.

Generally, the encapsulating material for solar cell is laminated or, as desired, crosslinked in an oven while the encapsulating material for solar cell is allowed to slightly leak from a transparent surface protective member (mainly glass) in order to prevent the solar cell module from being insufficiently loaded at the end portions. For example, in a case in which the encapsulating material for solar cell is laminated through, approximately, 3-minute depressurization and 10-minute heating at 150° C., there have been cases in which a disadvantage occurs in which the encapsulating material for solar cell that has been melted before crosslinking and leaked remains on a PTFE sheet on a laminator and the PTFE sheet is contaminated. The storage elastic modulus (G') at 150° C. refers to the elastic modulus of the encapsulating material for solar cell during the above-described melting, and the minimum value ($\eta^{*1}$) of the complex viscosity at a temperature in a range of 100° C. to lower than 135° C. and the complex viscosity ($\eta^{*2}$) at 150° C. refer to the viscosities of the encapsulating material for solar cell during the above-described melting.

The solid viscoelasticity in a shear mode can be measured by preparing a 0.5 mm-thick press sheet, measuring the solid viscoelasticity using a (HAAKE) ReoStress in a temperature range of 25° C. (room temperature) to 150° C. at a rate of temperature increase of 10° C./minute under the application of a frequency of 1.0 Hz, and then holding the press sheet at 150° C. for 5 minutes. The storage elastic modulus (G') can be read from the measurement profile.

When the complex viscosity ($\eta^{*2}$) at 150° C. is equal to or more than the above-described lower limit value, it is possible to reduce the amount of the resin leaking from the solar cell module during the lamination process. In addition, when the complex viscosity ($\eta^{*2}$) is equal to or less than the above-described upper limit value, it is possible to reduce the amount of the resin leaking from the solar cell module during the lamination process, and furthermore, the cracking of a solar cell element during the lamination process is suppressed.

When the storage elastic modulus (G') at 150° C. is equal to or more than the above-described lower limit value, the encapsulating material for solar cell leaked during the lamination process does not remain on the PTFE sheet or the oven in the laminator and it is possible to suppress the occurrence of disadvantages such as contamination. In addition, when the storage elastic modulus (G') is equal to or less than the above-described upper limit value, it is easy to peel the encapsulating material for solar cell from the PTFE sheet in the laminator. Furthermore, the cracking of the solar cell element during the lamination process is suppressed.

In a case in which the encapsulating material for solar cell is laminated through, for example, approximately, 3-minute depressurization and 10-minute heating at 150° C., the encapsulating material for solar cell is heated at the atmosphere after the depressurization. While depending on the module configuration or the laminator, the temperature range in which the encapsulating material for solar cell is heated at the atmosphere is in a range of approximately 80° C. to 140° C. and, even in this range, there are cases in which the disadvantage of the contamination of the laminator by the encapsulating material for solar cell from which the resin softened by the heating has leaked occurs. When the minimum value ($\eta^{*1}$) of the complex viscosity is present at a temperature in a range of 100° C. to lower than 135° C. and the minimum value ($\eta^{*1}$) is in a range of $6.0 \times 10^3$ Pa·s to $4.0 \times 10^4$ Pa·s, it is possible to reduce the amount of the resin leaking from the solar cell module during the lamination process. In addition, when the minimum value ($\eta^{*1}$) of the complex viscosity in a range of 100° C. to 150° C. is equal to or less than the above-described upper limit value, the cracking of the solar cell element during the lamination process is suppressed.

The encapsulating material for solar cell (I) of the present embodiment includes the organic peroxide having a one-minute half-life temperature in a range of 100° C. to 170° C. in a range of 0.1 parts by weight to 3 parts by weight with respect to 100 parts by weight of the ethylene/α-olefin copolymer. While the heating of the encapsulating material for solar cell decreases the complex viscosity, the inclusion of the organic peroxide brings about the decomposition and crosslinking of the organic peroxide in a range of 100° C. to lower than 135° C., and the inclusion of the organic peroxide changes the complex viscosity to increase, and thus the minimum value ($\eta^{*1}$) is obtained.

In order to set the minimum value ($\eta^{*1}$) of the complex viscosity at a temperature in a range of 100° C. to lower than 135° C. in the above-described range, for example, a resin having MFR, which is based on ASTM D1238 and measured under conditions of a temperature of 190° C. and a load of 2.16 kg, of preferably 3.0 g/10 minutes or less and more preferably less than 2.0 g/10 minutes is used. Then, it is possible to set the minimum value ($\eta^{*1}$) of the complex viscosity to equal to or more than $6.0 \times 10^3$ Pa·s.

In order to adjust the complex viscosity ($\eta^{*2}$) at 150° C. and the storage elastic modulus (G') of the encapsulating material for solar cell (I) of the present embodiment in the above-described ranges, it is important to highly accurately control, for example, factors such as (1) the composition and molecular weight of the ethylene/α-olefin copolymer and (2) the combinations and blending ratio of a variety of additives such as the organic peroxide.

The complex viscosity and the storage elastic modulus (G'), generally, decrease along with the temperature, and change to increase when a crosslinking reaction initiates. The height of the base line is dependent on, for example, the molecular weight of the copolymer and the content of the organic peroxide, and the temperature at which the crosslinking reaction initiates correlates with, for example, the decomposition temperature of the organic peroxide and the content of the organic peroxide.

For example, when the ethylene/α-olefin copolymer having a greater molecular weight is used, the complex viscosity curve and the storage elastic modulus curve shift upwards as a whole, and thus it is possible to further improve the complex viscosity ($\eta^{*2}$) at 150° C. and the storage elastic modulus (G'). In addition, when the organic peroxide having a smaller half-life temperature is used, the temperature at which the crosslinking reaction initiates shifts toward the lower temperature side, and thus it is possible to further improve the complex viscosity ($\eta^{*2}$) at 150° C. and the storage elastic modulus (G').

Therefore, when the above-described factors are highly accurately controlled, it is possible to adjust the complex viscosity ($\eta^{*2}$) at 150° C. and the storage elastic modulus (G') of the encapsulating material for solar cell according to the present embodiment in the above-described ranges.

Hereinafter, individual components configuring the encapsulating material for solar cell (I) of the present embodiment will be described.

(Ethylene/α-Olefin Copolymer)

A preferred embodiment of the encapsulating material for solar cell (I) of the present embodiment includes an ethylene/α-olefin copolymer satisfying specific requirements described below.

The ethylene/α-olefin copolymer used in the encapsulating material for solar cell (I) of the present embodiment is obtained by copolymerizing ethylene and an α-olefin having 3 to 20 carbon atoms. As the α-olefin, generally, it is possible to solely use an α-olefin having 3 to 20 carbon atoms or use a combination of two or more α-olefins having 3 to 20 carbon atoms. Among those α-olefins, α-olefins having 10 or less carbon atoms are preferred and α-olefins having 3 to 8 carbon atoms are particularly preferred. Specific examples of the above-described α-olefins include propylene, 1-butene, 1-pentene, 1-hexene, 3-methyl-1-butene, 3,3-dimethyl-1-butene, 4-methyl-1-pentene, 1-octene, 1-decene, and 1-dodecene. Propylene, 1-butene, 1-pentene, 1-hexene, 4-methyl-1-pentene, and 1-octene are preferred in terms of easy procurement. Meanwhile, the ethylene/α-olefin copolymer may be a random copolymer or a block copolymer, but is preferably a random copolymer from the viewpoint of flexibility.

The ethylene/α-olefin copolymer according to the present embodiment preferably satisfies at least one of the following requirements a1) to a4) and particularly preferably satisfies all the requirements a1) to a4) described below.

Hereinafter, the requirements a1) to a4) will be described.

(Requirement a1)

The content ratio of a structural unit, which is contained in the ethylene/α-olefin copolymer and is derived from ethylene, is preferably in a range of 80 mol % to 90 mol %. In addition, the ratio of a structural unit, which is derived from the α-olefin having 3 to 20 carbon atoms (hereinafter, also referred to as "α-olefin unit"), is preferably in a range of 10 mol % to 20 mol %, more preferably in a range of 12 mol % to 20 mol %, still more preferably in a range of 12 mol % to 18 mol %, and particularly preferably in a range of 13 mol % to 18 mol % (here, the total amount of the structural unit derived from ethylene and the α-olefin unit is 100 mol %). When the content ratio of the α-olefin unit is equal to or more than the above-described lower limit value, the crystallinity is appropriate and the transparency is favorable. In addition, the flexibility is also appropriate and it is possible to suppress the occurrence of cracking in the solar cell element or the chipping of the thin film electrode during the lamination molding of the solar cell module.

On the other hand, when the content ratio of the α-olefin unit is equal to or less than the above-described upper limit value, the resin composition does not significantly vary, sheet blocking can be suppressed, and the feeding property of the sheet is favorable. In addition, the ethylene/α-olefin copolymer is sufficiently crosslinked and the heat resistance is also favorable.

(Requirement a2)

The melt flow rate (MFR) of the ethylene/α-olefin copolymer, which is based on ASTM D1238 and measured under conditions of a temperature of 190° C. and a load of 2.16 kg, is preferably in a range of 0.1 g/10 minutes to 8.0 g/10 minutes. The lower limit value of the MFR is more preferably equal to or more than 0.2 g/10 minutes and still more preferably equal to or more than 0.5 g/10 minutes. In addition, the upper limit value of the MFR is more preferably equal to or less than 7.0 g/10 minutes, still more preferably equal to or less than 5.0 g/10 minutes, still more preferably equal to or less than 3.0 g/10 minutes, and particularly preferably less than 2.0 g/10 minutes. In the present embodiment, an ethylene/α-olefin copolymer having an MFR in a range of 0.1 g/10 minutes to less than 2.0 g/10 minutes is preferably used.

The MFR of the ethylene/α-olefin copolymer can be adjusted by adjusting the polymerization temperature and the polymerization pressure during a polymerization reaction described below, the molar ratio between the monomer concentration and the hydrogen concentration in ethylene and the α-olefin in a polymerization system, and the like.

When the MFR is equal to or more than the above-described lower limit value, the storage elastic modulus (G') and complex viscosity of the resin composition including the ethylene/α-olefin copolymer are appropriate, the leakage amount during the lamination process can be suppressed, and it is easy to peel the encapsulating material for solar cell from the PTFE sheet in the laminator. Furthermore, the cracking of the solar cell element during the lamination process is suppressed.

On the other hand, when the MFR is equal to or less than or less than the above-described upper limit value, the elastic modulus and complex viscosity of the resin composition including the ethylene/α-olefin copolymer are appropriate, the leakage amount during the lamination process can be suppressed, the encapsulating material for solar cell does not remain on the PTFE sheet or the oven in the laminator, and it is possible to suppress the occurrence of disadvantages such as contamination.

(Requirement a3)

The density of the ethylene/α-olefin copolymer, which is measured on the basis of ASTM D1505, is preferably in a range of 0.865 g/cm$^3$ to 0.884 g/cm$^3$, more preferably in a range of 0.866 g/cm$^3$ to 0.883 g/cm$^3$, still more preferably in a range of 0.866 g/cm$^3$ to 0.880 g/cm$^3$, and particularly preferably in a range of 0.867 g/cm$^3$ to 0.880 g/cm$^3$. The density of the ethylene/α-olefin copolymer can be adjusted using, for example, the balance between the content ratio of the ethylene unit and the content ratio of the α-olefin unit. That is, when the content ratio of the ethylene unit is increased, the crystallinity increases, and the ethylene/α-olefin copolymer having a high density can be obtained. On the other hand, when the content ratio of the ethylene unit is decreased, the crystallinity decreases, and the ethylene/α-olefin copolymer having a low density can be obtained.

When the density of the ethylene/α-olefin copolymer is equal to or less than the above-described upper limit value, the crystallinity is appropriate and the transparency is favorable. In addition, the flexibility is also appropriate, and it is possible to suppress the cracking of the solar cell element or the chipping of the thin film electrode during the lamination molding of the solar cell module.

On the other hand, when the density of the ethylene/α-olefin copolymer is equal to or more than the above-described lower limit value, the resin composition does not significantly vary, sheet blocking can be suppressed, and the feeding property of the sheet is favorable. In addition, the ethylene/α-olefin copolymer is sufficiently crosslinked and the heat resistance is also favorable.

(Requirement a4)

The shore A hardness of the ethylene/α-olefin copolymer, which is measured on the basis of ASTM D2240, is preferably in a range of 60 to 85, more preferably in a range of 62 to 83, still more preferably in a range of 62 to 80, and particularly preferably in a range of 65 to 80. The shore A hardness of the ethylene/α-olefin copolymer can be adjusted by adjusting the content ratio or density of the ethylene unit in the ethylene/α-olefin copolymer within the above-described numeric range. That is, the shore A hardness becomes great in the ethylene/α-olefin copolymer having a high content ratio of the ethylene unit and a high density. On the other hand, the shore A hardness becomes low in the ethylene/α-olefin copolymer having a low content ratio of the ethylene unit and a low density.

When the shore A hardness is equal to or more than the above-described lower limit value, the content of ethylene decreases (the content of the α-olefin increases). Therefore, the resin composition does not significantly vary, sheet blocking can be suppressed, and the feeding property of the sheet is favorable. In addition, the ethylene/α-olefin copolymer is sufficiently crosslinked and the heat resistance is also favorable.

On the other hand, when the shore A hardness is equal to or less than the above-described upper limit value, the crystallinity is appropriate and the transparency is favorable. In addition, the flexibility is also appropriate, and it is possible to suppress the cracking of the solar cell element or the chipping of the thin film electrode during the lamination molding of the solar cell module.

The ethylene/α-olefin copolymer according to the present embodiment preferably satisfies the following requirement a5) in addition to the above-described requirements a1) to a4) at the same time.

(Requirement a5)

The differential scanning calorimetry (DSC)-based melting peak of the ethylene/α-olefin copolymer is preferably in a range of 30° C. to 90° C., more preferably in a range of 33° C. to 90° C., and particularly preferably in a range of 30° C. to 88° C. When the melting peak is equal to or lower than the above-described upper limit value, the crystallinity is appropriate and the transparency is favorable. In addition, the flexibility is also appropriate, and there is a tendency that it is possible to suppress the cracking of the solar cell element or the chipping of the thin film electrode during the lamination molding of the solar cell module. When the melting peak is equal to or higher than the above-described lower limit value, the resin composition does not significantly vary, sheet blocking can be suppressed, and the feeding property of the sheet is favorable. In addition, the ethylene/α-olefin copolymer is sufficiently crosslinked and the heat resistance is also favorable.

(Method for Manufacturing the Ethylene/α-Olefin Copolymer)

The ethylene/α-olefin copolymer can be manufactured using a variety of metallocene compounds described below as a catalyst. Examples of the metallocene compounds that can be used include the metallocene compounds described in Japanese Unexamined Patent Publication No. 2006-077261, Japanese Unexamined Patent Publication No. 2008-231265, Japanese Unexamined Patent Publication No. 2005-314680, and the like. However, a metallocene compound having a different structure from those of the metallocene compounds described in the above-described patent documents may also be used, and a combination of two or more metallocene compounds may also be used.

Preferable examples of a polymerization reaction in which the metallocene compound is used include the following aspects.

Ethylene and one or more monomers selected from α-olefins and the like are supplied in the presence of a catalyst for olefin polymerization composed of the metallocene compound (I) and at least one compound (also referred to as a promoter) (II) selected from the group consisting of organic aluminumoxy compounds (II-1), compounds (II-2) that react with the metallocene compound (I) so as to form an ion pair, and organic aluminum compounds (II-3).

As the organic aluminumoxy compounds (II-1), the compounds (II-2) that react with the metallocene compound (I) so as to form an ion pair, and the organic aluminum compounds (II-3), for example, the metallocene compounds described in Japanese Unexamined Patent Publication No. 2006-077261, Japanese Unexamined Patent Publication No. 2008-231265, Japanese Unexamined Patent Publication No. 2005-314680, and the like can be used. However, a metallocene compound having a different structure from those of the metallocene compounds described in the above-described patent documents may also be used. The above-described compounds may be individually injected into a polymerization atmosphere or be brought into contact with each other in advance and then injected into a polymerization atmosphere. Furthermore, for example, the compounds may be carried by the fine particle-shaped inorganic oxide carrier described in Japanese Unexamined Patent Publication No. 2005-314680 or the like.

The ethylene/α-olefin copolymer is preferably manufactured without the substantial use of the compound (II-2) that reacts with the metallocene compound (I) so as to form an ion pair. This is because, when the compound (II-2) that forms an ion pair with the metallocene compound (I) remains in the ethylene/α-olefin copolymer, there is a tendency that the degradation of electrical characteristics is caused.

It is also possible to manufacture the ethylene/α-olefin copolymer in a system in which a well-known Ziegler-Natta catalyst of the related art and the organic aluminum compound (II-3) are used. In this case, it is possible to obtain an ethylene/α-olefin copolymer having excellent electric characteristics by decalcifying the manufactured resin with an acid and reducing the amount of metal components or ions contained in the resin. However, in the ethylene/α-olefin copolymer obtained using this method, there is a tendency that the acid or alkali is likely to remain and this acid or alkali causes the corrosion of electrodes. In addition, since the decalcification treatment is carried out, the cost of the ethylene/α-olefin copolymer also increases.

Therefore, the ethylene/α-olefin copolymer is preferably polymerized and manufactured in the presence of a catalyst for olefin polymerization made up of the metallocene compound (I) and at least one compound selected from the group consisting of the organic aluminumoxy compounds (II-1) and the organic aluminum compounds (II-3).

The polymerization of the ethylene/α-olefin copolymer can be carried out using any one of a well-known gas-phase polymerization method of the related art and a liquid-phase polymerization method such as a slurry polymerization method or a solution polymerization method. The polymerization is preferably carried out using the liquid-phase polymerization method such as the solution polymerization method. In a case in which the ethylene/α-olefin copolymer is manufactured by carrying out the copolymerization of ethylene and an α-olefin having 3 to 20 carbon atoms using the metallocene compound, the metallocene compound (I) is used in an amount in a range of, generally, $10^{-9}$ mole to $10^{-1}$ mole, and preferably $10^{-8}$ mole to $10^{-2}$ mole per a reaction volume of one liter.

The compound (II-1) is used at an amount at which the molar ratio [(II-1)/M] of the compound (II-1) to all transition metal atoms (M) in the compound (I) generally falls in a range of 1 to 10000 and preferably falls in a range of 10 to 5000. The compound (II-2) is used at an amount at which the molar ratio [(II-2)/M] of the compound (II-2) to all transition metal atoms (M) in the compound (I) generally falls in a range of 0.5 to 50 and preferably falls in a range of 1 to 20. The compound (II-3) is used at an amount per liter of the polymerization volume generally falling in a range of 0 millimoles to 5 millimoles and preferably falling in a range of approximately 0 millimoles to 2 millimoles.

In the solution polymerization method, when ethylene and an α-olefin having 3 to 20 carbon atoms are copolymerized in the presence of the above-described metallocene compound, it is possible to efficiently manufacture an ethylene/α-olefin copolymer having a large content of a copolymer, a narrow composition distribution and a narrow molecular weight distribution. Here, the preliminary molar ratio of ethylene to the α-olefin having 3 to 20 carbon atoms is generally in a range of 10:90 to 99.9:0.1, preferably in a range of 30:70 to 99.9:0.1, and more preferably in a range of 50:50 to 99.9:0.1 (ethylene:α-olefin).

As the α-olefin having 3 to 20 carbon atoms, a straight or branched α-olefin can be used, and examples thereof include propylene, 1-butene, 2-butene, 1-pentene, 3-methyl-1-butene, 1-hexene, 4-methyl-1-pentene, 3-methyl-1-pentene, 1-octene, 1-decene, 1-dodecene, and the like. Examples of the α-olefin that can be used in the solution polymerization method also include polar group-containing olefins. Examples of the polar group-containing olefins include α,β-unsaturated carboxylic acids such as acrylic acid, methacrylic acid, fumaric acid, and maleic anhydride and metal salts such as sodium salts of the α,β-unsaturated carboxylic acids; α,β-unsaturated carboxylic acid esters such as methyl acrylate, ethyl acrylate, n-propyl acrylate, methyl methacrylate, and ethyl methacrylate; vinyl esters such as vinyl acetate and vinyl propionate; unsaturated glycidyls such as glycidyl acrylate and glycidyl methacrylate; and the like. In addition, it is also possible to cause high-temperature solution polymerization in the co-presence of an aromatic vinyl compound, for example, styrenes such as styrene, o-methyl styrene, m-methyl styrene, p-methyl styrene, o,p-dimethyl styrene, methoxy styrene, vinylbenzoic acid, methyl vinyl-benzoate, vinylbenzyl acetate, hydroxystyrene, p-chlorostyrene, or divinylbenzene; 3-phenyl propylene, 4-phenyl propylene, a-methyl styrene, or the like in the reaction system. Among the above-described α-olefins, propylene, 1-butene, 1-hexene, 4-methyl-1-pentene, and 1-octene are preferably used. In addition, in the solution polymerization, cyclic olefins having 3 to 20 carbon atoms, for example, cyclopentene, cycloheptene, norbornene, 5-metyl-2-norbornene, and the like may be jointly joined.

The "solution polymerization method" is a collective term for all methods in which polymerization is carried out in a state in which a polymer is dissolved in an inert hydrocarbon solvent described below. In the solution polymerization method, the polymerization temperature is generally in a range of 0° C. to 200° C., preferably in a range of 20° C. to 190° C., and more preferably in a range of 40° C. to 180° C. In a case in which the polymerization temperature fails to satisfy 0° C., the solution polymerization method is not practical in terms of productivity since the polymerization activity is extremely degraded, and the removal of polymerization heat becomes difficult. Furthermore, when the polymerization temperature is higher than 200° C., the solution polymerization method is not practical in terms of productivity since the polymerization activity is extremely degraded.

The polymerization pressure is generally in a range of normal pressure to 10 MPa (gauge pressure), and preferably in a range of normal pressure to 8 MPa (gauge pressure). Copolymerization can be carried out in all of a batch method, a semi-continuous method, and a continuous method. The reaction time (the average retention time in a case in which a copolymer reaction is carried out using a continuous method) varies depending on the conditions such as the catalyst concentration and the polymerization temperature, and can be appropriately selected, but is generally in a range of one minute to three hours, and preferably in a range of ten minutes to 2.5 hours. Furthermore, it is also possible to carry out the polymerization in two or more steps with different reaction conditions. The molecular weight of the obtained ethylene/α-olefin copolymer can be adjusted by changing the hydrogen concentration or the polymerization temperature in the polymerization system. Furthermore, the molecular weight of the ethylene/α-olefin copolymer can also be adjusted using the amount of the compound (II) being used. In a case in which hydrogen is added, the amount of hydrogen is appropriately in a range of approximately 0.001 NL to 5000 NL per kilogram of the ethylene/α-olefin copolymer being generated. In addition, a vinyl group and a vinylidene group present at the ends of a molecule in the obtained ethylene/α-olefin copolymer can be adjusted by increasing the polymerization temperature and extremely decreasing the amount of hydrogen being added.

A solvent used in the solution polymerization method is generally an inert hydrocarbon solvent, and is preferably a saturated hydrocarbon having a boiling point in a range of 50° C. to 200° C. at normal pressure. Specific examples thereof include aliphatic hydrocarbon such as pentane, hexane, heptane, octane, decane, dodecane, and kerosene; and alicyclic hydrocarbon such as cyclopentane, cyclohexane, and methylcyclopentane. Meanwhile, aromatic hydrocarbons such as benzene, toluene, and xylene and halogenated hydrocarbon such as ethylene chloride, chlorobenzene, and dichloromethane also belong to the scope of the "inert hydrocarbon solvent", and the use thereof is not limited.

As described above, in the solution polymerization method, not only the organic aluminumoxy compound dissolved in the aromatic hydrocarbon, which was frequently used in the related art, but also modified methyl aluminoxane dissolved in the aliphatic hydrocarbon or the alicyclic hydrocarbon such as MMAO can be used. As a result, when the aliphatic hydrocarbon or the alicyclic hydrocarbon is employed as the solvent for the solution polymerization, it becomes possible to almost completely eliminate the possibility of the aromatic hydrocarbon being interfused into the polymerization system or the ethylene/α-olefin copolymer being generated. That is, the solution polymerization method also has characteristics in that the environmental load can be reduced and the influence on human health can be minimized. Meanwhile, to suppress the variation in properties, it is preferable to melt the ethylene/α-olefin copolymer obtained through the polymerization reaction and other components added as desired using an arbitrary method, and to knead and the ethylene/α-olefin copolymer and other components.

(Organic Peroxide)

The encapsulating material for solar cell (I) of the present embodiment contains an organic peroxide. The organic peroxide is used as a radical initiator during the graft modification of the silane coupling agent and the ethylene/α-olefin copolymer, and furthermore, is used as a radial initiator during a crosslinking reaction when the ethylene/α-olefin copolymer is lamination-molded to the solar cell module. When the silane coupling agent is graft-modified in the ethylene/α-olefin copolymer, a solar cell module having a favorable adhesiveness to the transparent surface protective member, the back surface protective member, a cell, and an electrode is obtained. Furthermore, when the ethylene/α-olefin copolymer is crosslinked, a solar cell module having excellent heat resistance and adhesiveness can be obtained.

As the organic peroxide being used, an organic peroxide which is capable of graft-modifying the silane coupling agent in the ethylene/α-olefin copolymer or crosslinking the ethylene/α-olefin copolymer and has a one-minute half-life temperature of the organic peroxide in a range of 100° C. to 170° C. in consideration of the balance of the crosslinking rate during the lamination molding of the solar cell module can be used. When the one-minute half-life temperature of the organic peroxide is equal to or higher than 100°, it becomes difficult for a gel to be generated in an encapsulating sheet for solar cell obtained from the resin composition during the sheet molding. In addition, since it is possible to suppress the sheet surface becoming uneven due to a generated gel-form substance, the degradation of the appearance can be prevented. In addition, since it is possible to prevent the occurrence of cracking in the sheet when voltage is applied, a decrease in the dielectric breakdown voltage can be prevented. Furthermore, the degradation of the moisture permeability can also be prevented. In addition, since it is possible to suppress the sheet surface becoming uneven, the tight adhesion among the transparent surface protective member, the cell, the electrode, and the back surface protective member becomes favorable during the lamination process of the solar cell module, and the adhesiveness also improves. When the one-minute half-life temperature of the organic peroxide is equal to or lower than 170° C., it is possible to suppress a decrease in the crosslinking rate during the lamination molding of the solar cell module, and therefore it is possible to prevent the degradation of the productivity of the solar cell module. In addition, it is also possible to prevent the degradation of the heat resistance and adhesiveness of the encapsulating material for solar cell. Furthermore, it is possible to appropriately carry out crosslinking after the lamination process or in an oven, and it is possible to suppress a laminator or the oven being contaminated.

A well-known organic peroxide can be used as the organic peroxide. Specific examples of the preferable organic peroxide having a one-minute half-life temperature in a range of 100° C. to 170° C. include dilauroyl peroxide, 1,1,3,3-tetramethylbutyl peroxy-2-ethylhexanoate, dibenzoyl peroxide, t-amylperoxy-2-ethylhexanoate, t-butylperoxy-2-ethylhexanotae, t-butylperoxy isobutyrate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy normaloctoate, 1,1-di(t-butylperoxy)-3,3, 5-trimethylcyclohexane, 1,1-di(t-butylperoxy)cyclohexane, t-butylperoxy isopropyl carbonate, t-butylperoxy-2-ethylhexylcarbonate, 2,5-dimethyl-2,5-di(benzoylperoxy) hexane, t-amyl-peroxybenzoate, t-butylproxy acetate, t-butylperoxy isononanoate, 2,2-di(t-butylperoxy)butane, t-butylperoxy benzoate, and the like. Preferable examples thereof include dilauroyl peroxide, t-butylperoxy isopropyl carbonate, t-butyl peroxy acetate, t-butylperoxy isononanoate, t-butylperoxy-2-ethylhexyl carbonate, and t-butylperoxy benzoate. The above-described organic peroxide may be solely used, or a mixture of two or more organic peroxides may be used.

The content of the organic peroxide in the encapsulating material for solar cell (I) is in a range of 0.1 parts by weight to 3.0 parts by weight with respect to 100 parts by weight of the above-described ethylene/α-olefin copolymer. The content is more preferably in a range of 0.2 parts by weight to 3.0 parts by weight, and particularly preferably in a range of 0.2 parts by weight to 2.5 parts by weight.

When the content of the organic peroxide is equal to or more than the above-described lower limit value, the degradation of the crosslinking characteristics such as the crosslinking degree or crosslinking rate of the encapsulating material for solar cell is suppressed, and the graft reaction of the silane coupling agent with the main chain of the ethylene-based copolymer becomes favorable, whereby it is possible to obtain the encapsulating material for solar cell having favorable adhesion. Furthermore, it is possible to appropriately carry out crosslinking after the lamination process or in an oven, and it is possible to suppress a laminator or the oven being contaminated.

When the content of the organic peroxide is equal to or less than the above-described upper limit value, a gel is not generated in an encapsulating sheet for solar cell obtained from the resin composition during sheet molding, the sheet surface is even, and the appearance is favorable. In addition, since there is no gel, cracking does not occur due to the gel-form substance in the sheet even when voltage is applied so that the insulating fracture resistance is favorable. In addition, the moisture permeability is also favorable. Furthermore, since the sheet surface is not uneven, the adhesiveness among the transparent surface protective member, the cell, the electrode, and the back surface protective member is also favorable during the lamination process of the solar cell module.

(Silane Coupling Agent)

The encapsulating material for solar cell (I) of the present embodiment preferably contains a silane coupling agent. The content of the silane coupling agent in the encapsulating material for solar cell (I) of the present embodiment is preferably in a range of 0.1 parts by weight to 5 parts by weight, more preferably in a range of 0.1 parts by weight to 4 parts by weight, and particularly preferably in a range of 0.1 parts by weight to 3 parts by weight with respect to 100 parts by weight of the ethylene/α-olefin copolymer.

When the content of the silane coupling agent is equal to or more than the above-described lower limit value, the adhesiveness is improved. On the other hand, when the content of the silane coupling agent is equal to or less than the above-described upper limit value, it is possible to suppress the addition amount of the organic peroxide for causing a graft reaction of the silane coupling agent in the ethylene/α-olefin copolymer during the lamination of the solar cell module. Therefore, a gel is not generated in an encapsulating sheet for solar cell obtained from the resin composition during the sheet molding, the sheet surface is not uneven, and the appearance is favorable. In addition, since there is no gel, cracking does not occur due to the gel-form substance in the sheet even when voltage is applied, and thus the insulating fracture resistance is favorable. In addition, the moisture permeability is also favorable.

In addition, there are cases in which the silane coupling agent causes a condensation reaction, is present in a white band form in the encapsulating material for solar sheet, and the product appearance deteriorates; however, when the content of the silane coupling agent is equal to or less than the above-described upper limit value, the generation of the white bands can be suppressed.

A well-known silane coupling agent of the related art can be used as the silane coupling agent, and there is no particular limitation. Specific examples thereof that can be used include vinyltriethoxysilane, vinyl trimethoxysilane, vinyl tris(β-methoxyethoxy)silane, 2-(3,4-epoxy cyclohexyl)ethyl trimethoxysilane, 3-glycidoxypropyl methyl dimethoxysilane, 3-glycidoxypropyl trimethoxysilane, 3-glycidoxypropyl methyl diethoxysilane, 3-glycidoxypropyl triethoxysilane, p-styryltrimethoxysilane, 3-aminopropyltriethoxysilane, 3-aminopropyltrimethoxysilane, N-2-(aminoethyl)-3-aminopropylmethyldimethoxysilane, N-2-(aminoethyl)-3-aminopropyltrimethoxysilane, 3-triethoxysiryl-N-(1,3-dimethyl-butylidene)propylamine, N-phenyl-3-aminopropyltrimethoxysilane, 3-ureidopropyltriethoxysilane, 3-isocyanatepropyl triethoxysilane, 3-methacryloxypropyl trimethoxysilane, 3-methacryloxypropyl methyldimethoxysilane, 3-methacryloxypropyl methyldimethoxysilane, 3-methacryloxypropyl triethoxysilane, 3-methacryloxypropyl methyldiethoxysilane, 3-acryloxypropyl trimethoxysilane, and the like. Preferable examples include 3-glycidoxypropyl trimethoxysilane, 3-glycidoxypropyl triethoxysilane, 3-aminopropyl triethoxysilane, 3-methacryloxypropyl trimethoxysilane, 3-methacryloxypropyl triethoxysilane, 3-acryloxypropyl trimethoxysilane, and vinyltriethoxysilane which have favorable adhesiveness.

(Ultraviolet Absorber, Light Stabilizer, and Heat-Resistant Stabilizer)

The encapsulating material for solar cell (I) according to the present embodiment preferably further contains at least one additive selected from the group consisting of an ultraviolet absorber, alight stabilizer, and a heat-resistant stabilizer. The blending amount of these additives is preferably in a range of 0.005 parts by weight to 5 parts by weight with respect to 100 parts by weight of the ethylene/α-olefin copolymer. Furthermore, the encapsulating material for solar cell preferably contains at least two additives selected from the three additives, and particularly preferably contains all the three additives. When the blending amount of the additives is within the above-described range, effects that improve high-temperature and high-humidity resistance, heat cycle resistance, weather resistance stability, and heat-resistant stability are sufficiently ensured and it is possible to prevent the degradation of the transparency of the encapsulating material for solar cell or the adhesiveness between glass, back sheets, solar cell elements, electrodes, and aluminum, which is preferable.

Specific examples of the ultraviolet absorber include benzophenone-based ultraviolet absorbers such as 2-hydroxy-4-normal-octyloxylbenzophenone, 2-hydroxy-4-methoxybenzophenone, 2,2-dihydroxy-4-methoxybenzophenone, 2-hydroxy-4-methoxy-4-carboxybenzophenone, and 2-hydroxy-4-n-octoxybenzophenone; benzotriazole-based ultraviolet absorbers such as 2-(2-hydroxy-3,5-di-t-butylphenyl)benzotriazole and 2-(2-hydroxy-5-methylpheyl)benzotriazole; and salicylic acid ester-based ultraviolet absorbers such as phenyl salicylate and p-octyl phenyl salicylate.

Examples of the light stabilizer include hindered amine-based light stabilizers such as bis(2,2,6,6-tetramethyl-4-piperidyl)sebacate, poly[{6-(1,1,3,3-tetramehtylbutyl)amino-1,3,5-triazine-2,4-diyl}{(2,2,6,6-tetramethyl-4-piperidyl)imino}hexamethylene{(2,2,6,6-tetramethyl-4-piperidyl)imino}]; hindered piperidine-based compounds, and the like.

In addition, it is also possible to use a low molecular weight hindered amine-based light stabilizer of the following general formula (1).

In the above general formula (1), $R_1$ and $R_2$ represent hydrogen, an alkyl group, or the like. $R_1$ and $R_2$ may be either identical or different. $R_1$ and $R_2$ are preferably hydrogen or methyl groups. $R_3$ represents hydrogen, an alkyl group, an alkenyl group or the like. $R_3$ is preferably hydrogen or a methyl group.

Specific examples of the hindered amine-based light stabilizer represented by the general formula (1) include 4-acryloyloxy-2,2,6,6-tetramethylpyperidine, 4-acryloyloxy-1,2,2,6,6-pentamethylpyperidine, 4-acryloyloxy-1-ethyl-2,2,6,6-tetramethylpyperidine, 4-acryloyloxy-1-propyl-2,2,6,6-tetramethylpyperidine, 4-acryloyloxy-1-butyl-2,2,6,6-tetramethylpyperidine, 4-methacryloyloxy-2,2,6,6-tetramethylpyperidine, 4-methacryloyloxy-1,2,2,6,6-pentamethylpyperidine, 4-methacryloyloxy-1-ethyl-2,2,6,6-tetramethylpyperidine, 4-methacryloyloxy-1-butyl-2,2,6,6-tetramethylpyperidine, 4-crotonoyloxy-2,2,6,6-tetramethylpyperidine, 4-crotonoyloxy-1-propyl-2,2,6,6-tetramethylpyperidine, and the like.

In addition, hindered amine-based light stabilizers having a high molecular weight represented by the following formulae (2) to (11) can also be used. The hindered amine-based light stabilizer having a high molecular weight refers to a light stabilizer having a molecular weight in a range of 1000 to 5000.

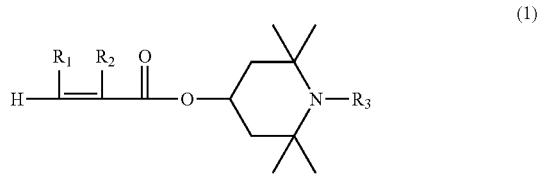

(1)

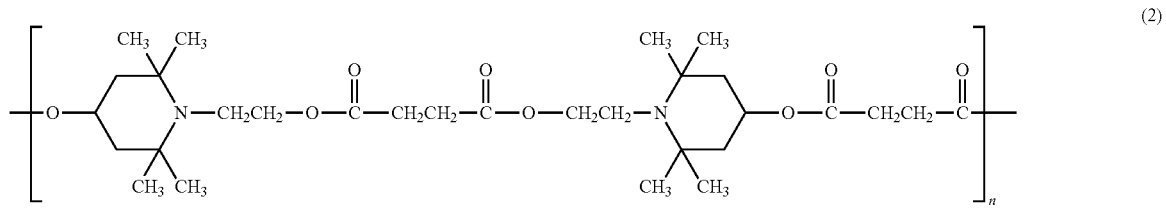

(2)

(3) (4)

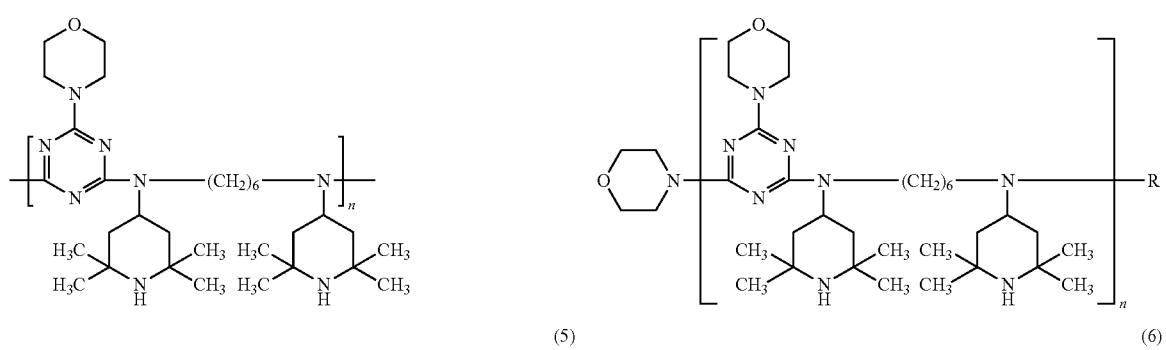

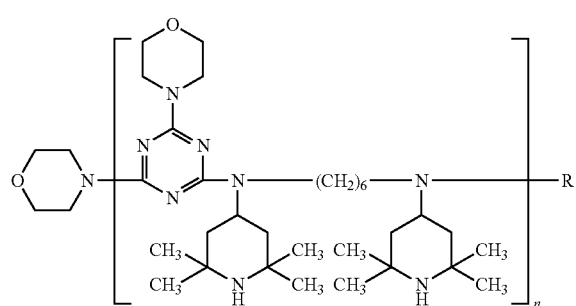

(5) (6)

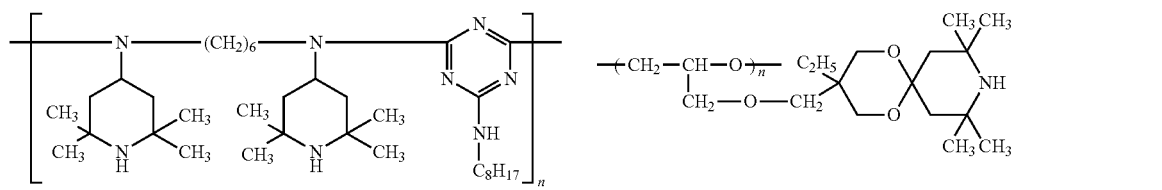

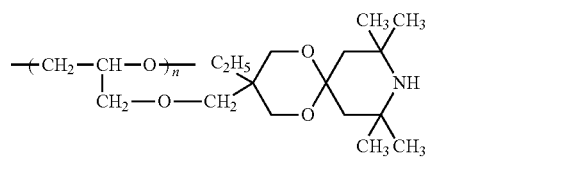

(7) (8)

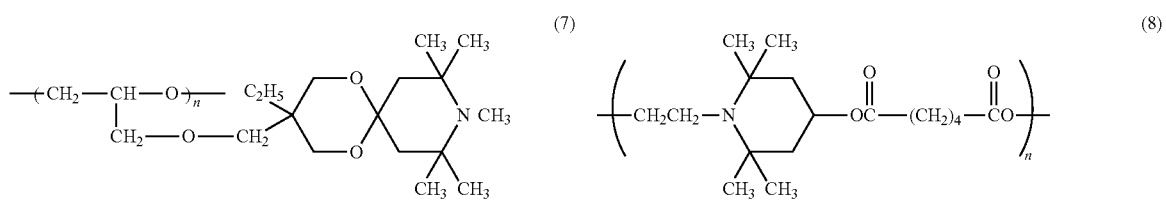

-continued

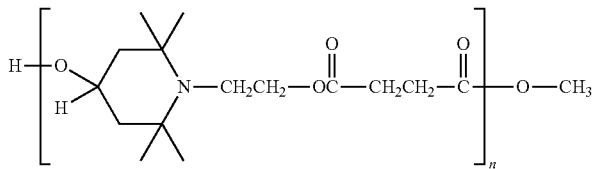
(9)

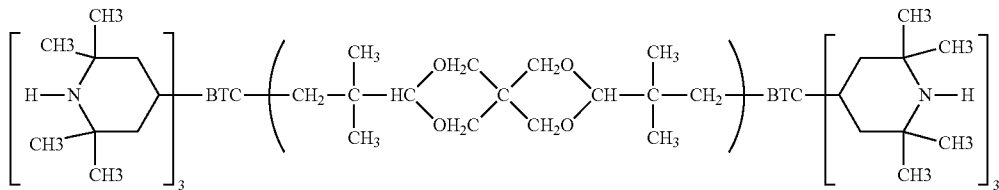
(10)

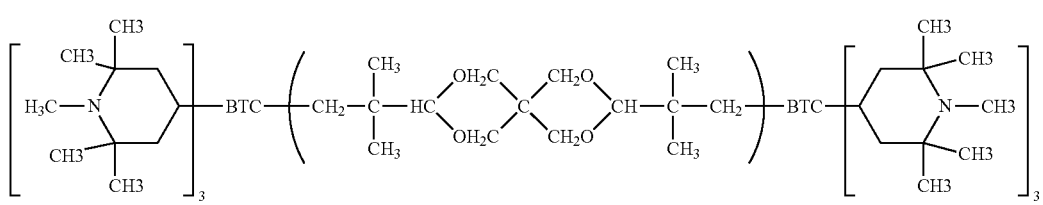
(11)

n = 4~6

Specific examples of the heat-resistant stabilizer include phosphite-based heat-resistant stabilizers such as tris(2,4-di-t-butylphenyl)phosphite, bis[2,4-bis(1,1-dimethylethyl)-6-methylphenyl]ethyl ester phosphite, tetrakis(2,4-di-t-butylphenyl)[1,1-biphenyl]-4,4'-diylbisphosphonite, and bis(2,4-di-t-butylphenyl)pentaerythritol diphosphite; lactone-based heat-resistant stabilizers of reaction products of 3-hydroxy-5,7-di-tert-butyl-furan-2-on and o-xylene; hindered phenol-based heat-resistant stabilizers such as 3,3',3",5,5',5"-hexa-t-butyl-a,a',a"-(methylene-2,4,6-triyl)tri-p-cresol, 1,3,5-trimethyl-2,4,6-tris(3,5-di-t-butyl-4-hydroxyphenyl)benzyl benzene, pentaerythritol tetrakis[3-(3,5-di-t-butyl-4-hydroxyphenyl)propionate], octadecyl-3-(3,5,-di-t-butyl-4-hydroxyphenyl)propionate, and thiodiethylenebis[3-(3,5-di-t-butyl-4-hydroxyphenyl)propionate]; sulfur-based heat-resistant stabilizers; amine-based heat-resistant stabilizers; and the like. These heat-resistant stabilizers can be singly used, or a combination of two or more heat-resistant stabilizers can also be used. Among them, phosphite-based heat-resistant stabilizers and hindered phenol-based heat-resistant stabilizers are preferred.

(Other Additives)

The resin composition configuring the encapsulating material for solar cell (I) can appropriately contain a variety of components other than the components described above in detail within the scope of the purpose of the present invention. For example, other than the ethylene/α-olefin copolymer, a variety of polyolefins, styrene-based or ethylene-based block copolymers, propylene-based polymers, and the like can be contained. The content of these components may be in a range of 0.0001 parts by weight to 50 parts by weight and preferably in a range of 0.001 parts by weight to 40 parts by weight with respect to 100 parts by weight of the ethylene/α-olefin copolymer. In addition, it is possible to appropriately contain one or more additives selected from a variety of resins other than polyolefins and/or a variety of rubbers, a plasticizer, an antistatic agent, an antimicrobial agent, an antifungal agent, a flame retardant, a crosslinking aid, and a dispersant. The resin composition configuring the encapsulating material for solar cell (I) can also contain a colorant, and in this case, the amount of the colorant added is generally less than 1 part by weight, preferably equal to or less than 0.5 parts by weight, and more preferably 0 parts by weight with respect to 100 parts by weight of the ethylene/α-olefin copolymer.

Particularly, in a case in which the crosslinking aid is contained, when the amount of the crosslinking aid blended is in a range of 0.05 parts by weight to 5 parts by weight with respect to 100 parts by weight of the ethylene/α-olefin copolymer. When the content of the crosslinking aid is within the above-described range, it is possible to provide an appropriate crosslinking structure, and to improve heat resistance, mechanical properties, and adhesiveness, which is preferable.

A well-known crosslinking aid of the related art that is ordinarily used for olefin-based resins can be used as the crosslinking aid. The crosslinking aid is a compound having double bonds in the molecule. Specific examples thereof include monoacrylates such as t-butyl acrylate, lauryl acrylate, cetyl acrylate, stearyl acrylate, 2-methoxyethyl acrylate, ethylcarbitol acrylate, and methoxytripropylene glycol acrylate; monomethacrylates such as t-butyl methacrylate, lauryl methacrylate, cetyl methacrylate, stearyl methacrylate, methoxyethylene glycol methacrylate, and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, and polypropylene glycol diacrylate; dimethacrylates such as 1,3-butanediol dimethacrylate, 1,6-hexanediol dimethacrylate, 1,9-nonanediol methacrylate, neopentyl glycol dimethacrylate, ethylene glycol dimethacrylate, diethylene glycol dimethacrylate, triethylene glycol dimethacrylate, and polyethylene glycol dimethacrylate; triacrylates such as trimethylol propane triacrylate, tetramethylol methane triacrylate, and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; divinyl aromatic compounds such as divinyl benzene and di-i-propenyl benzene; cyanurates such as triallyl cyanurate and triallyl isocyanurate; diallyl compounds such as diallyl phthalate; triallyl compounds: oximes such as p-quinone dioxime and p,p'-dibenzoyl quinone dioxime; and maleimides such as phenyl maleimide. Among the above-described crosslinking aids, diacrylate, dimethacrylate, divinyl aromatic compounds, triacrylates such as trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; cyanurates such as triallyl cyanurate and triallyl isocyanurate; diallyl compounds such as diallyl phthalate; triallyl compounds; oximes such as p-quinone dioxime and p,p'-dibenzoyl quinonedioxime; maleimides such as phenyl maleimide are more preferred. Furthermore, among the above-described crosslinking aids, triallyl isocyanurate is particularly preferred since the generation of air bubbles in the encapsulating material for solar cell after lamination is most suppressed and the balance between crosslinking characteristics is excellent.

The entire shape of the encapsulating material for solar cell (I) of the present embodiment is preferably a sheet shape as described below. In addition, in a long-term reliability test in which a crosslinked sheet obtained from a sheet-shaped encapsulating material for solar cell (I) cut into sizes of a thickness of 0.5 mm, a length of 75 mm, and a width of 60 mm which has been depressurized for 3 minutes and heated for 10 minutes on a hot plate at 150° C. is left to stand in a constant temperature and humidity vessel having a temperature of 85° C. and a relative humidity of 85% for 2000 hours, when the yellow index of the crosslinked sheet before the long-term reliability test is represented by $YI_1$, and the yellow index of the crosslinked sheet after the long-term reliability test is represented by $YI_2$, the change ratio of the yellow index defined as $(YI_2-YI_1)$ is preferably less than 2, and more preferably equal to or less than 1.5.

2. Encapsulating Material for Solar Cell (II) (Encapsulating Material for Back Surface of Solar Cell)

An encapsulating material for solar cell (II) is a colored encapsulating material for the back surface of a solar cell exclusively used as an encapsulating material for a back surface. The encapsulating material for solar cell (II) includes, as essential components, the same ethylene/α-olefin copolymer as the ethylene/α-olefin copolymer configuring the encapsulating material for solar cell (I), the same organic peroxide as the organic peroxide configuring the encapsulating material for solar cell (I), and a colorant. The blending amount of the organic peroxide that is a component of the encapsulating material for solar cell (II) is the same as the blending amount of the encapsulating material for solar cell (I). Hereinafter, the rheology characteristics peculiarly exhibited by the encapsulating material for solar cell (II) of the present embodiment and the colorant included in the encapsulating material for solar cell (II) as an essential component will be described.

In the encapsulating material for solar cell (II) of the present embodiment, that is, the encapsulating material for a back surface of a solar cell, the minimum viscosity of the complex viscosity ($\eta^{*3}$) in solid viscoelasticity measurement in a measurement temperature range of 25° C. to 180° C. at a frequency of 0.016 Hz and a rate of temperature increase of 3° C./minute in a shear mode is equal to or more than $4.0\times10^3$ Pa·s, preferably equal to or more than $6.0\times10^3$ Pa·s, and still more preferably equal to or more than $2.0\times10^4$ Pa·s.

In addition, in the encapsulating material for a back surface of a solar cell of the present embodiment, the minimum viscosity of the complex viscosity ($\eta^{*3}$) in solid viscoelasticity measurement in a measurement temperature range of 25° C. to 180° C. at a frequency of 0.016 Hz and a rate of temperature increase of 3° C./minute in a shear mode is equal to or less than $1.0\times10^6$ Pa·s and preferably equal to or less than $5.0\times10^5$ Pa·s.

Generally, in the encapsulating material for a back surface of a solar cell, the complex viscosity decreases as the temperature increases. In addition, the complex viscosity abruptly increases at a certain temperature. This abrupt increase in the complex viscosity is caused by, for example, the initiation of a crosslinking reaction of the encapsulating material for a back surface of a solar cell caused by the decomposition of the organic peroxide included in the encapsulating material for a back surface of a solar cell. Therefore, the minimum viscosity of the complex viscosity refers to the viscosity at a temperature in which the complex viscosity is about to abruptly increase and means the complex viscosity when the crosslinking reaction initiates.

According to the present inventors' studies, since an encapsulating material for a back surface of a solar cell of the related art including low-density polyethylene as a main component is thermoplastic, it has been clarified that the complex viscosity is low, for example, in a temperature range of 140° C. to 170° C. during the lamination process and disadvantages occur in which, during the lamination process or crosslinking in an oven when a solar cell module is manufactured, the colored encapsulating material for a back surface of a solar cell sneaks into the surfaces of a solar cell element, wires, and the like, and the conversion efficiency of the solar cell element decreases. In addition, even in a thermal-crosslinking encapsulating material for solar cell including an organic peroxide of the related art, it has been clarified that the complex viscosity is low at the initiation of the crosslinking reaction and thus disadvantages occur in which, during the lamination process or crosslinking in an oven when a solar cell module is manufactured, the colored encapsulating material for a back surface of a solar cell sneaks into the surfaces of a solar cell element, wires, and the like, and the conversion efficiency of the solar cell element decreases. Therefore, the present inventors intensively carried out studies in order to solve the above-described disadvantages occurring when the solar cell module is manufactured. As a result, the present inventors found that, when the minimum viscosity of the complex viscosity ($\eta^{*3}$) is adjusted in a specific range, it is possible to obtain an encapsulating material for a back surface of a solar cell capable of suppressing the sneaking of the encapsulating material for a back surface of a solar cell into the surfaces of the solar cell element, wires, and the like, and the present inventors completed the present invention.

When the minimum viscosity of the complex viscosity ($\eta^{*3}$) is equal to or more than the above-described lower limit value, it is possible to suppress the sneaking of the colored encapsulating material for a back surface of a solar cell into the surfaces of the solar cell element, wires, and the like when a solar cell module is produced.

In addition, when the minimum viscosity of the complex viscosity ($\eta^{*3}$) is equal to or less than the above-described upper limit value, it is possible to improve the property of the encapsulating material to fill the periphery of the solar cell element or the wires. Furthermore, it is possible to suppress the cracking of the solar cell element, the distortion of a wire material, and the like.

In the present embodiment, it is important for the complex viscosity ($\eta^{*3}$) to have the minimum value in a measurement temperature range of 25° C. to 180° C., and in a case in which the viscosity uniformly decreases, there are cases in which sneaking occurs in spite of the same MFR (190° C. and a load of 2.16 kg).

Therefore, according to the present invention, when the minimum viscosity of the complex viscosity ($\eta^{*3}$) is set in the above-described range, it is possible to obtain an encapsulating material for a back surface of a solar cell capable of suppressing the sneaking of the colored encapsulating material for a back surface of a solar cell into the surfaces of the solar cell element, wires, and the like when a solar cell module is produced.

In order to adjust the minimum viscosity of the complex viscosity ($\eta^{*3}$) of the encapsulating material for a back surface of a solar cell according to the present embodiment in the above-described range, it is important to highly accurately control, for example, factors such as (1) the composition and molecular weight of the ethylene/α-olefin copolymer and (2) the combinations and blending ratio of a variety of additives such as the organic peroxide.

The complex viscosity curve generally decreases with the temperature and changes to increase when a crosslinking reaction initiates. The height of the base line is dependent on the molecular weight of the copolymer and the content of the organic peroxide, and the temperature at which the complex viscosity changes to increase, that is, the minimum viscosity is obtained correlates with the decomposition temperature of the organic peroxide and the content of the organic peroxide.

For example, when an ethylene/α-olefin copolymer having a greater molecular weight is used, the complex viscosity curve shifts upwards as a whole, and thus it is possible to further improve the minimum viscosity of the complex viscosity ($\eta^{*3}$). In addition, when an organic peroxide having a smaller half-life temperature is used, the temperature at which the minimum viscosity is obtained shifts toward the lower temperature side, and thus it is possible to further improve the minimum viscosity of the complex viscosity ($\eta^{*3}$).

Therefore, when the above-described factors are highly accurately controlled, it is possible to adjust the minimum viscosity of the complex viscosity ($\eta^{*3}$) of the encapsulating material for a back surface of a solar cell according to the present embodiment in the above-described range.

(Colorant)

The encapsulating material for a back surface of a solar cell of the present embodiment, that is, the encapsulating material for aback surface of a solar cell (II) includes, as an essential component, a colorant in a range of 1 part by weight to 30 parts by weight with respect to 100 parts by weight of the ethylene/α-olefin copolymer. When the colorant is included, the improvement of the conversion efficiency of the solar cell module by the light reflection function, the improvement of design properties, the improvement of thermal conductivity, and the like can be expected. Particularly, when a white colorant is included, the improvement of the conversion efficiency of the solar cell module by the light reflection function can be expected.

As the colorant, a well-known colorant of the related art can be used. In the present embodiment, the colorant is at least one selected from organic pigments, dyes, and inorganic fillers. In the present embodiment, as the colorant, a colorant including an inorganic filler is preferably used, a colorant having a content of an inorganic filler of equal to or more than 20% by weight is more preferably used, a colorant having a content of an inorganic filler of equal to or more than 40% by weight is still more preferably used, and a colorant only made of an inorganic filler is most preferably used since it is easy to develop the effects of the present invention and the process can be simplified.

As the inorganic filler, particularly, at least one selected from the group consisting of natural mica, synthetic mica, titanium oxide, aluminum oxide, calcium carbonate, talc, clay, magnesium carbonate, kaolinite, and diatomite can be used. Among them, titanium oxide, aluminum oxide, calcium carbonate, talc, clay, and magnesium carbonate are preferred, titanium oxide, aluminum oxide, and calcium carbonate are more preferred, and titanium oxide is particularly preferred. The colorant may be used in a master batch form with a well-known resin such as polyolefin as long as the content of the colorant is in a range of 1 part by weight to 30 parts by weight with respect to 100 parts by weight of the ethylene/α-olefin copolymer. The content of the colorant in the master batch is preferably equal to or more than 20% by weight, and the content of the colorant in the master batch is more preferably equal to or more than 40% by weight.

The present inventors found that, in order to ensure the long-term stability of the solar cell module of the present invention with resistance against heat and humidity, the content of an acidic compound included in the encapsulating material for a back surface of a solar cell is extremely important. That is, the content of the acidic compound included in the encapsulating material for a back surface of a solar cell is preferably equal to or less than 8 weight ppm. More preferable long-term stability with resistance against heat and humidity is ensured by selecting the type and amount of the inorganic filler so that the content of a sulfate radical ($SO_4^{2-}$) in the encapsulating material for a back surface of a solar cell reaches equal to or less than 8 weight ppm, preferably reaches equal to or less than 5 weight ppm, and more preferably reaches equal to or less than 3 weight ppm.

The upper limit of the content of the colorant in the encapsulating material for a back surface of a solar cell is equal to or less than 30 parts by weight, preferably equal to or less than 20 parts by weight, preferably equal to or less than 10 parts by weight, and more preferably equal to or less than 8 parts by weight with respect to 100 parts by weight of the ethylene/α-olefin copolymer. In addition, the lower limit of the content of the colorant in the encapsulating material for a back surface of a solar cell is equal to or more than 1 part by weight and preferably equal to or more than 2 parts by weight with respect to 100 parts by weight of the ethylene/α-olefin copolymer. The colorant may be directly blended with the ethylene/α-olefin copolymer or may be blended after the formation of a high-concentration master batch in advance.

(Organic Peroxide, Silane Coupling Agent, and Other Additives)

As described above, the type and blending amount of the organic peroxide which is an essential component configuring the encapsulating material for solar cell (II) and the types and blending amounts of the silane coupling agent, the ultraviolet absorber, the light stabilizer, the heat-resistant stabilizer, and other additives as the arbitrary components are the same as the type and blending amount described in the description of the encapsulating material for solar cell (I).

(Encapsulating Material for Back Surface of Solar Cell)

Regarding the method for manufacturing the encapsulating material for a back surface of a solar cell, the shape of the encapsulating material for a back surface, and the embossing process that may be carried out on the sheet surface, those described regarding the encapsulating material for solar cell (I) are applied to the encapsulating material for a back surface of a solar cell with no change.

In the encapsulating material for a back surface of a solar cell of the present embodiment, the total light transmittance in a wavelength range of 430 nm to 800 nm is preferably equal to or less than 10%, and more preferably equal to or less than 8%. When the total light transmittance is equal to or less than the above-described upper limit value, it is possible to assist energy conversion in the solar cell element by reflecting light incident on the encapsulating material for a back surface of a solar cell and to further improve the power generation efficiency.

In addition, in the encapsulating material for a back surface of a solar cell of the present embodiment, the light reflectance in a wavelength range of 430 nm to 800 nm is preferably equal to or more than 70%, and more preferably equal to or more than 80%. When the light reflectance is equal to or more than the above-described lower limit value, it is possible to assist energy conversion in the solar cell element by reflecting light incident on the encapsulating material for a back surface of a solar cell and to further improve the power generation efficiency.

3. Method for Manufacturing Encapsulating Materials for Solar Cell (I) and (II)

The encapsulating material for solar cell according to the present embodiment, that is, both the encapsulating material for solar cell (I) and the encapsulating material for solar cell (II) (hereinafter, in some cases, both will be collectively referred to as "the encapsulating material for solar cell" unless there is a necessity to particularly distinctively describe both), is excellent in terms of the balance among adhesiveness with a variety of solar cell members such as glass, a back sheet, a thin film electrode, an aluminum frame, and a solar cell element, heat resistance, calendar moldability, and crosslinking characteristics, and furthermore, is excellent in terms of transparency, flexibility, weather resistance, volume intrinsic resistance, electric insulating properties, moisture permeability, electrode corrosion properties, and process stability. Therefore, the encapsulating material for solar cell is preferably used as an encapsulating material for solar cell for a well-known solar cell module of the related art. Regarding the method for manufacturing an encapsulating material for solar cell of the present embodiment, the encapsulating material for solar cell can be manufactured through melting and blending using an ordinarily-used method such as a kneader, a Banbury mixer, an extruder, or a calendar molder; however, among them, the encapsulating material for solar cell can be preferably manufactured using a calendar molder.

The encapsulating materials for solar cell (I) and (II) are one of embodiments in which the entire shape is also preferably a sheet shape. In addition, an encapsulating material for solar cell complexed with other layers including at least one sheet made of the above-described ethylene-based resin composition can also be preferably used. The thickness of the layer of the encapsulating material for solar cell is generally in a range of 0.01 mm to 2 mm, preferably in a range of 0.05 mm to 1.5 mm, more preferably in a range of 0.1 mm to 1.2 mm, still more preferably in a range of 0.2 mm to 1 mm, particularly preferably in a range of 0.3 mm to 0.9 mm, and most preferably in a range of 0.3 mm to 0.8 mm. When the thickness is within the above-described range, it is possible to suppress the breakage of glass, a solar cell element, a thin film electrode and the like during the lamination step and to ensure sufficient light transmittance, thereby obtaining a great light power generation amount. Furthermore, the lamination molding of the solar cell module at a low temperature is possible, which is preferable.

There is no particular limitation regarding the method for molding sheets of the encapsulating material for solar cell (I) and (II), and a variety of well-known molding methods (cast molding, extrusion sheet molding, inflation molding, injection molding, compression molding, calendar molding and the like) can be employed. Particularly, a method is most preferred in which a calendar molder with which a sheet or film having a desired thickness is produced by rolling a molten resin using a heated metal roll (calendar roll) is used, and calendar molding is carried out while the ethylene/α-olefin copolymer, the silane coupling agent, the organic peroxide, the ultraviolet absorber, the light stabilizer, the heat-resistant stabilizer, and other additives used if necessary are melted and kneaded, thereby obtaining a sheet-shaped encapsulating material for solar cell. A variety of well-known calendar molders can be used as the calendar molder, and it is possible to use a mixing roll, a three roll calendar, or a four roll calendar. Particularly, I-type, S-type, inverse L-type, Z-type, and inclined Z-type calendar rolls can be used as the four roll calendar. In addition, the ethylene-based resin composition is preferably heated to an appropriate temperature before being applied to the calendar roll, and it is also one of preferable embodiments to install, for example, a Banbury mixer, a kneader, an extruder, or the like.

Regarding the temperature range for the calendar molding, the roll temperature is preferably set in a range of, ordinarily, 40° C. to 100° C. When the roll temperature is set to lower than 40° C., the jamming properties of the ethylene-based resin composition into the bank are degraded and the productivity of the encapsulating material for solar cell degrades. On the other hand, when the roll temperature exceeds 100° C., the gelation of the encapsulating material for solar sheet is caused when a sheet of the encapsulating material for solar cell is obtained using a calendar molder, the sheet surface becomes uneven due to a gel-form substance, and there are cases in which the appearance deteriorates. In addition, when voltage is applied to the sheet containing a gel-form substance, cracking occurs at the periphery of the gel-form substance in the sheet, and the insulating fracture resistance decreases. Furthermore, moisture permeation easily occurs at the interfaces of the gel-form substance and the moisture permeability degrades. In addition, since the sheet surface is not even, the tight adhesion among glass, the solar cell element, the electrode, and the back sheet deteriorates and the adhesiveness also degrades during the lamination process of the solar cell module.

In addition, the surface of the sheet (or the layer) of the encapsulating material for solar cell may be embossed. When the sheet surface of the encapsulating material for solar cell is decorated through an embossing process, it is possible to prevent the blocking between the encapsulating sheets or between the encapsulating sheet and other sheets.

Furthermore, since embosses decrease the storage elastic modulus (G') of the encapsulating material for solar cell, the embosses serve as cushions for the solar cell element and the like during the lamination of the encapsulating material for solar cell and the solar cell element, and the breakage of the solar cell element can be prevented.

The porosity P (%), which is expressed by the percentage ratio $(V_H/V_A) \times 100$ of the total volume $V_H$ of the concave portions per the unit area of a sheet of the encapsulating material for solar cell to the apparent volume $V_A$ of the sheet of the encapsulating material for solar cell is preferably in a range of 10% to 50%, more preferably in a range of 10% to 40%, and still more preferably in a range of 15% to 40%. Meanwhile, the apparent volume $V_A$ of the sheet of the encapsulating material for solar cell can be obtained by multiplying the unit area by the maximum thickness of the encapsulating material for solar cell. When the porosity P is less than 10%, it is not possible to sufficiently decrease the elastic modulus of the encapsulating material for solar cell, and therefore it is not possible to obtain sufficient cushion properties. Therefore, when the lamination process (pressurization step) is carried out in two phases in a step of manufacturing the module, there are cases in which, in a crystalline solar cell, the crystalline solar cell element or a solder fixing the crystalline solar cell element and an electrode is cracked; in a thin film-based solar cell, a silver electrode is cracked. That is, when the porosity P of the encapsulating material for solar cell including the sheet made of the ethylene-based resin composition is less than 10%, in a case in which a pressure is locally added to the encapsulating material for solar cell, convex portions to which the pressure is added do not deform and thus do not break. Therefore, during the lamination process, for example, a large pressure is locally added to the crystalline solar cell element or the like, and the crystalline solar cell element breaks. In addition, when the porosity P of the encapsulating material for solar cell is equal to or less than the above-described upper limit value, the number of air ventilation paths is small, and therefore deaeration becomes poor during the lamination process. Therefore, there are cases in which the air remains in the solar cell module and thus the appearance deteriorates or the electrode is corroded due to moisture in the remaining air when the solar cell module is used for a long period of time. Furthermore, during the lamination, the flown ethylene-based resin composition does not fill the pores and thus leaks outside individual adherends to the solar cell module, and thus there are cases in which the laminator is contaminated.

On the other hand, when the porosity P is more than the above-described upper limit value, it is not possible to fully deaerate the air during the pressurization in the lamination process, and therefore the air is likely to remain in the solar cell module. Therefore, the appearance of the solar cell module deteriorates or the electrode is corroded due to moisture in the remaining air when the solar cell module is used for a long period of time. In addition, since it is not possible to fully deaerate the air during the pressurization in the lamination process, the attaching area between the encapsulating material for solar cell and the adherends decreases, and a sufficient adhering strength cannot be obtained.

The porosity P can be obtained through the following calculation. The apparent volume $V_A$ (mm³) of the embossed encapsulating material for solar cell is computed through the product of the maximum thickness $t_{max}$(mm) and unit area (for example, 1 m² = 1000×1000 = 10⁶ mm²) of the encapsulating material for solar cell as described in the following equation (2).

$$V_A \text{ (mm}^3\text{)} = t_{max} \text{ (mm)} \times 10^6 \text{ (mm}^2\text{)} \quad (2)$$

Meanwhile, the actual volume $V_0$ (mm³) of the unit area of the encapsulating material for solar cell is computed by applying the specific weight ρ (g/mm³) of a resin configuring the encapsulating material for solar cell and the actual weight W (g) of the encapsulating material for solar cell per unit area (1 m²) to the following equation (3).

$$V_0 \text{ (mm}^3\text{)} = W/\rho \quad (3)$$

The total volume $V_H$ (mm³) of the concave portions per the unit area of the encapsulating material for solar cell is computed by subtracting the "actual volume $V_0$" from the "apparent volume $V_A$ of the encapsulating material for solar cell" as described in the following equation (4).

$$V_H \text{ (mm}^3\text{)} = V_A - V_0 = V_A - (W/\rho) \quad (4)$$

Therefore, the porosity P (%) can be obtained in the following manner.

$$\begin{aligned}\text{Porosity } P(\%) &= (V_H/V_A \times 100) \\ &= ((V_A - (W/\rho))/V_A) \times 100 \\ &= (1 - W/(\rho \cdot V_A)) \times 100 \\ &= (1 - W/(\rho \cdot t_{max} \cdot 10^6)) \times 100\end{aligned}$$

The porosity P (%) can be obtained using the above-described equation, and can also be obtained by photographing a cross-section or embossed surface of an actual encapsulating material for solar cell using a microscope and then processing the image or the like.

The depth of the concave portion formed through the embossing process is preferably in a range of 20% to 95%, more preferably in a range of 50% to 95%, and more preferably in a range of 65% to 95% of the maximum thickness of the encapsulating material for solar cell. There is a case in which the percentage ratio of the depth D of the concave portion to the maximum thickness $t_{max}$ of the sheet is called the "depth ratio" of the concave portion.

The depth of the concave portion by the embossing process indicates the depth difference D between the top portion of the convex portion and the bottom portion of the concave portion in the uneven surface of the encapsulating material for solar cell formed through the embossing process. In addition, the maximum thickness $t_{max}$ of the encapsulating material for solar cell indicates the distance from the top portion of the convex portion on one surface to the other surface (in the thickness direction of the encapsulating material for solar cell) in a case in which only one surface of the encapsulating material for solar cell is embossed, and indicates the distance from the top portion of the convex portion on one surface to the bottom portion of the proportion portion on the other surface (in the thickness direction of the encapsulating material for solar cell) in a case in which both surfaces of the encapsulating material for solar cell are embossed.

The embossing process may be carried out on a single surface or on both surfaces of the encapsulating material for solar cell. In a case in which the depth of the concave portion through the embossing process is set to be large, the concave portions are preferably formed only on a single surface of the encapsulating material for solar cell. In a case in which the embossing process is carried out only on a single surface of the encapsulating material for solar cell, the maximum thickness $t_{max}$ of the encapsulating material for solar cell is preferably in a range of 0.01 mm to 2 mm, more preferably in a range of 0.05 mm to 1 mm, still more preferably in a range of 0.1 mm to 1 mm, still more preferably in a range of 0.15 mm to 1 mm, still more preferably in a range of 0.2 mm to 1 mm, still more preferably in a range of 0.2 mm to 0.9 mm, still more preferably in a range of 0.3 mm to 0.9 mm, and most preferably in a range of 0.3 mm to 0.8 mm. When the maximum thickness $t_{max}$ of the encapsulating material for solar cell is within the above-described range, it is possible to suppress the breakage of glass, the solar cell element, the thin film electrode and the like, and to laminate-mold the solar cell module at a relative low temperature, which is preferable. In addition, the encapsulating material for solar cell is capable of ensuring a sufficient light transmittance, and the solar cell module for which the above-described encapsulating material for solar cell is used has a high light transmittance.

Furthermore, a sheet thereof can be used as an encapsulating material for solar cell in a leaflet form that has been cut in accordance with the size of the solar cell module or in a roll form that can be cut in accordance with the size immediately before the solar cell module is produced. The sheet-shaped encapsulating material for solar cell which is a preferable embodiment of the present invention needs to have at least one layer made of the encapsulating material for solar cell. Therefore, the number of the layers made of the encapsulating material for solar cell of the present embodiment may be one or multiple. The number of the layers made of the encapsulating material for solar cell of the present invention is preferably one since the structure can be simplified so as to decrease the cost, the interface reflection between layers is extremely decreased, and light is effectively used.

The encapsulating material for solar cell of the present embodiment may be configured only of layers made of the encapsulating material for solar cell of the present embodiment, or may have layers other than a layer containing the encapsulating material for solar cell (hereinafter, also referred to as "other layers"). The other layers can be classified based on the purposes into, for example, a hard coat layer for protecting the front surface or the back surface, an adhering layer, an antireflection layer, a gas barrier layer, an anti-contamination layer, and the like. The other layers can be classified based on the material into, for example, an ultraviolet-curable resin layer, a thermosetting resin layer, a polyolefin resin layer, a carboxylic acid-modified polyolefin resin layer, a fluorine-containing resin layer, a cyclic olefin (co)polymer layer, an inorganic compound layer, and the like.

There is no particular limitation with the positional relationship between the layer made of the encapsulating material for solar cell of the present embodiment and the other layers, and a preferable layer configuration is appropriately selected in consideration of the relationship with the object of the present invention. That is, the other layers may be provided between two or more layers made of the encapsulating material for solar cell, may be provided on the outermost layer of the encapsulating material for solar cell, or may be provided at locations other than what has been described above. In addition, the other layers may be provided only on a single surface or on both surfaces of the layer made of the encapsulating material for solar cell. The number of the other layers is not particularly limited, and an arbitrary number of other layers may be provided or no other layer may be provided.

To simplify the structure so as to decrease the cost, extremely decrease the interface reflection between layers, and effectively use light, it is preferable to produce the encapsulating material for solar cell only with a layer made of the encapsulating material for solar cell of the present embodiment without providing the other layers. However, when there are layers necessary or useful in terms of purpose, the other layers may be provided as appropriate. In a case in which the other layers are provided, there is no particular limitation with a method for laminating a layer made of the encapsulating material for solar cell of the present embodiment and the other layers; however, for example, (i) a method in which layers are co-extruded using a well-known melt extruder such as a casting molder, an extrusion sheet molder, an inflation molder or an injection molder, thereby obtaining a laminate, (ii) a method in which one layer is melted or laminated by heating on the other layer that has been formed in advance, thereby obtaining a laminate, or (iii) a method in which a plurality of calendar molders is arrayed, sheets exhausted from the respective calendar molders are overlaid and rolled is preferred.

In addition, the layers may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation, or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited), an ethylene/vinyl acetate-based copolymer, an adhesive resin composition containing what has been described above, or the like) is used. An adhesive having heat resistance in a range of approximately 120° C. to 150° C. is preferably used as the adhesive, and preferable examples thereof include polyester-based adhesives, polyurethane-based adhesive, and the like. In addition, to improve the adhesiveness between both surfaces, for example, a silane-based coupling treatment, a titanium-based coupling treatment, a corona treatment, a plasma treatment or the like may be used.

4. Solar Cell Module

A typical example of the solar cell module is a crystalline solar cell module obtained by, generally, sandwiching a solar cell element formed of polycrystalline silicon or the like using the encapsulating material for solar cell, laminating the solar cell element, and furthermore, covering the front and back surfaces with protective sheets. That is, a typical solar cell module has a configuration of a protective sheet for a solar cell module (a transparent surface protective member)/the encapsulating material for solar cell 1 (encapsulating material 1)/the solar cell element/the encapsulating material for solar cell 2 (encapsulating material 2)/a protective sheet for a solar cell module (a back surface protective member).

Regarding the configuration of the encapsulating material for the front and back surfaces of the solar cell in the crystalline solar cell module included in the present invention, there are three patterns (A) to (C) described in Table 1.

TABLE 1

| Solar cell module | Encapsulating material 1 (for front surface) | Encapsulating material 2 (for back surface) |
|---|---|---|
| (A) | Encapsulating material for solar cell (I) of the present invention | Well-known encapsulating material for back surface other than encapsulating material for solar cell (II) |
| (B) | Well-known encapsulating material for front surface other than encapsulating material for solar cell (I) | Encapsulating material for solar cell (II) of the present invention |
| (C) | Encapsulating material for solar cell (I) of the present invention | Encapsulating material for solar cell (II) of the present invention |

The solar cell module with Pattern (A) exhibits effects of preventing the leakage of the encapsulating material for a front surface of a solar cell 1, the contamination of the manufacturing apparatus, and the cracking of the solar cell element and, at the same time, also has excellent long-term reliability. The solar cell module with Pattern (B) exhibits effects of preventing the sneaking of the encapsulating material for a back surface of a solar cell 2 or the cracking of the solar cell element. The solar cell module with Pattern (C) is a solar cell module in which any of the leakage of the encapsulating material for a front surface 1, the contamination of the manufacturing apparatus, sneaking, and the cracking of the solar cell element do not occur, and the long-term reliability is also excellent.

In the solar cell module with Pattern (B) or Pattern (C), the minimum value ($\eta^{*3}$) of the complex viscosity of the encapsulating material for solar cell (II), which is measured through solid viscoelasticity measurement under conditions of a measurement temperature range of 25° C. to 180° C., a frequency of 0.016 Hz, a rate of temperature increase of 3° C./minute, and a shear mode, and the minimum value ($\eta^{*0}$) of the complex viscosity of the encapsulating material for solar cell that may be the encapsulating material for solar cell (I) of the present invention or a well-known encapsulating material other than the encapsulating material (I), which is measured under the same conditions, preferably satisfy the following relationship formula (Eq1), more preferably satisfy the following relationship formula (Eq2), still more preferably satisfy the following relationship formula (Eq3), and particularly preferably satisfy the following relationship formula (Eq4).

$$-2.0 \leq \text{Log}(\eta^{*3}/\eta^{*0}) \leq 3.0 \quad \text{(Eq1)}$$

$$-1.0 \leq \text{Log}(\eta^{*3}/\eta^{*0}) \leq 2.5 \quad \text{(Eq2)}$$

$$0 \leq \text{Log}(\eta^{*3}/\eta^{*0}) \leq 2.5 \quad \text{(Eq3)}$$

$$0.6 \leq \text{Log}(\eta^{*3}/\eta^{*0}) \leq 2.3 \quad \text{(Eq4)}$$

However, the present invention is not limited to the above-described configuration by any means, and some of the above-described layers can be appropriately removed or layers other than the above-described layers can be appropriately provided within the scope of the object of the present invention. Examples of layers other than the above-described layers include an adhering layer, a shock absorbing layer, a coating layer, an anti-reflection layer, a back surface re-reflection layer and a light diffusion layer. The above-described layers are not particularly limited, and can be provided at appropriate locations in consideration of the purpose or characteristics of providing the respective layers. When the solar cell element used in the module is a crystalline power generation element, there is a possibility of PID being observed, and thus the present invention can be particularly preferably applied.

Furthermore, the present invention does not limit by any means the use of the encapsulating material for solar cell of the present invention, particularly the encapsulating material for solar cell (I) as an encapsulating material for solar cell modules other than crystalline solar cell modules, for example, thin film silicon-based (amorphous silicon-based) solar cell modules, hybrid-type solar cell modules, tandem-type solar cell modules, field-effect solar cell modules.

Hereinafter, a variety of solar cell modules for which the encapsulating material for solar cell of the present invention can be used will be described.

(Crystalline Silicon-Based Solar Cell Module)

FIG. 1 is a cross-sectional view schematically illustrating an embodiment of the solar cell module of the present invention. Meanwhile, in FIG. 1, an example of the configuration of a crystalline silicon-based solar cell module 20 is illustrated. As illustrated in FIG. 1, the solar cell module 20 includes a plurality of crystalline silicon-based solar cell elements 22 electrically connected through an interconnector 29 and a pair of a transparent surface protective member 24 and a back surface protective member 26 which sandwich the solar cell elements, and an encapsulating layer 28 is loaded between the protective members and a plurality of the solar cell elements 22. The encapsulating layer 28 is obtained by attaching, heating and pressurizing the encapsulating material for solar cell according to the present embodiment, and is in contact with electrodes formed on the light-receiving surfaces and back surfaces of the solar cell elements 22. The electrodes refer to collector members respectively formed on the light-receiving surfaces and the back surfaces of the solar cell elements 22, and the electrode includes collector lines, tab-type busbars, a back surface electrode layer, and the like which will be described below.

Figure 2:
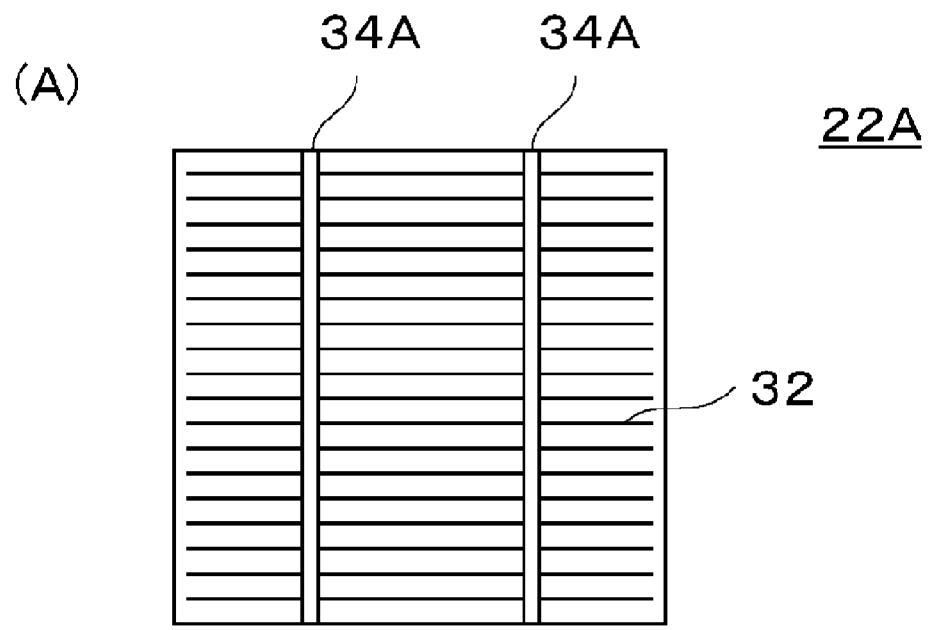
FIG. 2 is a plan view schematically illustrating a configuration example of a light-receiving surface and a back surface of a solar cell element.
Figure 2:
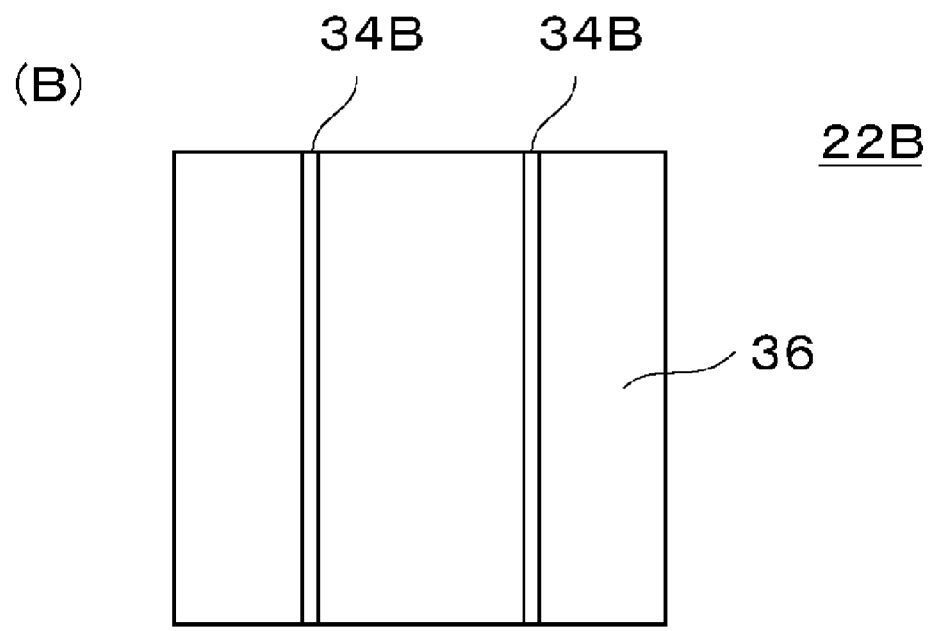

FIG. 2 is a plan view schematically illustrating a configuration example of the light-receiving surface and the back surface of the solar cell element. In FIG. 2, examples of the configurations of a light-receiving surface 22A and a back surface 22B of the solar cell element 22 are illustrated. As illustrated in FIG. 2(A), a number of linearly-formed collector lines 32 and tab-type busbars (busbars) 34A which collect charges from the collector lines 32 and are connected to the interconnector 29 are formed on the light-receiving surface 22A of the solar cell element 22. In addition, as illustrated in FIG. 2(B), a conductive layer 36 (back surface electrode) is formed on the entire back surface 22B of the solar cell element 22, and tab-type busbars (busbars) 34B which collect charges from the conductive layer 36 and are connected to the interconnector 29 are formed on the conductive layer. The line width of the collector line 32 is, for example, approximately 0.1 mm; the line width of the tab-type busbar 34A is, for example, in a range of approximately 2 mm to 3 mm; and the line width of the tab-type busbar 34B is, for example, in a range of approximately 5 mm to 7 mm. The thicknesses of the collector line 32, the tab-type busbar 34A and the tab-type busbar 34B are, for example, in a range of approximately 20 μm to 50 μm respectively.

The collector line 32, the tab-type busbar 34A and the tab-type busbar 34B preferably contain highly conductive metal. Examples of the highly conductive metal include gold, silver, copper, and the like, and silver, a silver compound, a silver-containing alloy, and the like are preferred due to the high conduction property or high corrosion resistance. The conductive layer 36 preferably contains not only highly conductive metal but also a highly light-reflecting component, for example, aluminum since light incident on the light-receiving surface is reflected so as to improve the photoelectric conversion efficiency of the solar cell element. The collector line 32, the tab-type busbar 34A, the tab-type busbar 34B, and the conductive layer 36 are formed by applying a coating material of a conductive material containing the above-described highly conductive metal to the light-receiving surface 22A or the back surface 22B of the solar cell element 22 to a thickness of a coated film of 50 μm through, for example, screen printing, then, drying the coated film, and, if necessary, baking the coated film at a temperature in a range of, for example, 600° C. to 700° C.

The transparent surface protective member 24 is disposed on the light-receiving surface side, and is thus required to be transparent. Examples of the transparent surface protective member 24 include a transparent glass plate, a transparent resin film, and the like. On the other hand, the back surface protective member 26 is not required to be transparent, and a material for the back surface protective member is not particularly limited. Examples of the back surface protective member 26 include a glass substrate, a plastic film, and the like, and a glass substrate is preferably used from the viewpoint of durability or transparency.

The solar cell module 20 can be obtained using an arbitrary manufacturing method. The solar cell module 20 can be obtained using a step in which a laminate of the back surface protective member 26, the encapsulating material for solar cell, a plurality of the solar cell elements 22, the encapsulating material for solar cell and the transparent surface protective member 24 laminated in this order is obtained; a step in which the laminate is pressurized and attached using a laminator or the like, and is heated at the same time as necessary; and a step in which, after the above-described steps, a heating treatment is further carried out on the laminate as necessary so as to cure the encapsulating material.

Generally, a collection electrode for extracting generated electricity is disposed in the solar cell element. Examples of the collection electrode include a busbar electrode, a finger electrode, and the like. Generally, the collection electrode is disposed on the front and back surfaces of the solar cell element; however, when the collection electrode is disposed on the light-receiving surface, the collection electrode shields light, and therefore a problem of the degradation of the power generation efficiency is caused.

In recent years, in order to improve the power generation efficiency, there has been proposed a back contact-type solar cell element not including the collection electrode disposed on the light-receiving surface. In an aspect of the back contact-type solar cell element, p-doped regions and n-doped regions are alternately provided on the opposite side (back surface side) to the light-receiving surface of the solar cell element. In another aspect of the back contact-type solar cell element, a p/n junction is formed in a substrate provided with through holes, a doped layer on the front surface (light-receiving surface) side is formed on up to the inner walls of the through holes and the periphery portions of the through holes on the back surface side, and a current on the light-receiving surface is extracted on the back surface side.

(Thin Film Silicon-Based Solar Cell Module)

The thin film silicon-based (amorphous silicon-based) solar cell module can be (1) a module in which the transparent surface protective member (the glass substrate)/a thin film solar cell element/an encapsulating layer/the back surface protective member are laminated in this order; (2) a module in which the transparent surface protective member/ the encapsulating layer/the thin film solar cell element/the encapsulating layer/the back surface protective member are laminated in this order; or the like. The transparent surface protective member, the back surface protective member and the encapsulating layer are the same as in the case of the above-described "crystalline silicon-based solar cell module".

The thin film solar cell element in the (1) aspect includes, for example, a transparent electrode layer/a pin-type silicon layer/a back surface electrode layer in this order. Examples of the transparent electrode layer include semiconductor-based oxides such as $In_2O_3$, $SnO_2$, ZnO, $Cd_2SnO_4$, and ITO (an oxide obtained by adding Sn to $In_2O_3$). The back surface electrode layer includes, for example, a silver thin film layer. The respective layers are formed using a plasma chemical vapor deposition (CVD) method or a sputtering method. The encapsulating layer is disposed so as to be in contact with the back surface electrode layer (for example, a silver thin film layer). Since the transparent electrode layer is formed on the transparent surface protective member, the encapsulating layer is not often disposed between the surface protective member and the transparent electrode layer.

The thin film solar cell element in the (2) aspect includes, for example, the transparent electrode layer/the pin-type silicon layer/a metal foil or a metal thin film layer (for example, a silver thin film layer) disposed on a heat-resistant macromolecular film in this order. Examples of the metal foil include a stainless steel foil and the like. Examples of the heat-resistant macromolecular film include a polyimide film and the like. The transparent electrode layer and the pin-type silicon layer are, similar to those in the (1) aspect, formed using the CVD method or the sputtering method. That is, the pin-type silicon layer is formed on the metal foil or the metal thin film layer disposed on the heat-resistant macromolecular film; and furthermore, the transparent electrode layer is formed on the pin-type silicon layer. In addition, the metal thin film layer disposed on the heat-resistant macromolecular film is also formed using the CVD method or the sputtering method.

In this case, the encapsulating layer is disposed between the transparent electrode layer and the transparent surface protective member; and between the metal foil or the heat-resistant macromolecular film and the back surface protective member respectively. As described above, the encapsulating layer obtained from the encapsulating material for solar cell is in contact with the collector line, the busbar for tab attachment, and the electrode such as the conductive layer of the solar cell element. In addition, compared with the crystalline silicon-based crystalline solar cell element, since the silicon layer is thinner in the solar cell element for a thin film solar cell in the (2) aspect, the silicon layer is not easily broken due to pressurization during the manufacturing of the solar cell module or the external impact during the operation of the module. Therefore, the flexibility of the encapsulating material for solar cell used for the thin film solar cell module may be lower than that of the encapsulating material for solar cell used for the crystalline silicon-based solar cell module. Meanwhile, since the electrode of the thin film solar cell element is a metal thin film layer as described above, in a case in which the electrode is deteriorated due to corrosion, there is a concern that the power generation efficiency may significantly decrease. Therefore, the encapsulating material for solar cell of the present invention including the sheet made of the ethylene-based resin composition which has poorer flexibility than the ethylene/vinyl acetate copolymer (EVA) but does not necessarily requires a crosslinking agent that serves as a main cause for the generation of decomposed gas is more preferably used as an encapsulating material for solar cell for a thin film solar cell module.

In addition, there is a solar cell module in which silicon is used for the solar cell element as another aspect of the solar cell module. Examples of the solar cell module in which silicon is used for the solar cell element include a hybrid-type (HIT-type) solar cell module in which crystalline silicon and amorphous silicon are laminated, a multi-junction-type (tandem-type) solar cell module in which silicon layers having different absorption wavelength ranges are laminated, aback contact-type solar cell module in which p-doped regions and n-doped regions are alternately provided on the back surface side which is provided on the opposite side to the light-receiving surface of the solar cell element, a spherical silicon-type solar cell module in which a number of spherical silicon particles (having a diameter of approximately 1 mm) and a concave mirror (also serving as the electrode) which has a diameter in a range of 2 mm to 3 mm and improves the light-gathering capability are combined together, and the like. In addition, examples of the solar cell module in which silicon is used for the solar cell element include a field-effect-type solar cell module having a structure in which the role of an amorphous silicon-type p-type window layer having the pin junction structure of the related art is provided to the "inversion layer being induced by the field effect" instead of the "insulated transparent electrode", and the like. In addition, examples thereof include a GaAs-based solar cell module in which monocrystalline GaAs is used for the solar cell element; a CIS or CIGS-based (chalcopyrite-based) solar cell module in which a group compound called a chalcopyrite-based compound made of Cu, In, Ga, Al, Se, S, or the like is used as the solar cell element instead of silicon; a CdTe—CdS-based solar cell in which a Cd compound thin film is used as the solar cell element, a $Cu_2ZnSnS_4$ (CZTS) solar cell module, and the like. The encapsulating material for solar cell of the present embodiment can be used as an encapsulating material for solar cell for all of the above-described solar cell modules.

Particularly, the encapsulating material layer laminated below a photovoltaic element configuring the solar cell module is required to have adhesiveness to the encapsulating material layer, the electrode, and the back surface protective material laminated on the top portion of the photovoltaic element. In addition, the encapsulating material layer is required to have thermal plasticity to hold the flatness of the back surface of the solar cell element as the photovoltaic element. Furthermore, the encapsulating material layer is required to have excellent scratch resistance, shock absorbance and the like to protect the solar cell element as the photovoltaic element.

The encapsulating material layer desirably has heat resistance. Particularly, when the solar cell module is manufactured, it is desirable that an ethylene-based resin composition configuring the encapsulating material layer not be modified and deteriorated or decomposed due to the heating action in a lamination method or the like in which the encapsulating material layer is suctioned in a vacuum, heated and pressurized or the action of heat such as sunlight during the long-term use of the solar cell module and the like. When the additives and the like contained in the ethylene-based resin composition are eluted or decomposed substances are generated, the elution of the additive and the generation of the decomposed substances act on the electromotive force surface (the element surface) of the solar cell element, and the function and performance of the solar cell element are deteriorated. Therefore, the heat resistance is an essential characteristic for the encapsulating material layer for solar cell module. Furthermore, the encapsulating material layer preferably has an excellent moisture-proof property. In this case, it is possible to prevent moisture from transmitting from the back surface side of the solar cell module, and to prevent the corrosion and deterioration of the photovoltaic element in the solar cell module.

Unlike the encapsulating material layer laminated on the photovoltaic element, the above-described encapsulating material layer is not essentially required to have transparency. The encapsulating material for solar cell of the present embodiment has the above-described characteristics, and can be preferably used as the encapsulating material for solar cell on the back surface side of the crystalline solar cell module and the encapsulating material for solar cell for the thin film-type solar cell module that is weak against moisture intrusion.

(Transparent Surface Protective Member for Solar Cell Module)

There is no particular limitation with the transparent surface protective member for solar cell module used in the solar cell module, but the transparent surface protective member is located on the outermost surface layer of the solar cell module, and thus preferably has performances for ensuring long-term reliability for the outdoor exposure of the solar cell module including weather resistance, water repellency, contamination resistance, and mechanical strength. In addition, the transparent surface protective member is preferably a sheet having a small optical loss and high transparency for the effective use of sunlight.

Examples of a material for the transparent surface protective member for solar cell module include a resin film group consisting of a polyester resin, a fluorine resin, an acryl resin, a cyclic olefin (co)polymer, an ethylene/vinyl acetate copolymer, or the like, a glass substrate, and the like. The resin film is preferably a polyester resin having excellent transparency, strength, cost, and the like, and particularly preferably a polyethylene terephthalate resin, a fluorine resin having favorable weather resistance, or the like. Examples of the fluorine resin include an ethylene/tetrafluoroethylene copolymer (ETFE), a polyvinyl fluoride resin (PVF), a polyvinylidene fluoride resin (PVDF), a polytetrafluoroethylene resin (PTFE), a fluorinated ethylene/propylene copolymer (FEP), and a poly trifluorochloroethylene resin (PCTFE). The polyvinylidene fluoride resin is excellent from the viewpoint of weather resistance, and the ethylene tetrafluoroethylene copolymer is excellent in terms of satisfying both weather resistance and mechanical strength. In addition, to improve the adhesiveness to materials configuring other layers such as an encapsulating material layer, it is desirable to carry out a corona treatment and a plasma treatment on the surface protective member. In addition, it is also possible to use a sheet that has been subjected to a stretching treatment, for example, a biaxially stretched polypropylene sheet to improve the mechanical strength.

In a case in which a glass substrate is used as the transparent surface protective member for solar cell module, the total light transmittance of the glass substrate with respect to light having a wavelength in a range of 350 nm to 1400 nm is preferably equal to or more than 80%, and more preferably equal to or more than 90%. It is usual to use as the glass substrate a super white glass plate that only slightly absorbs the infrared region, but a blue glass plate has a small influence on the output characteristics of the solar cell module when the blue glass plate has a thickness of equal to or less than 3 mm. In addition, it is possible to obtain reinforced glass through a thermal treatment to increase the mechanical strength of the glass substrate, but a float glass plate that has not been subjected to a thermal treatment may be used. In addition, the light-receiving surface side of the glass substrate may be coated for antireflection to suppress reflection.

(Back Surface Protective Member for Solar Cell Module)

There is no particular limitation with the back surface protective member for solar cell module used in the solar cell module, but the back surface protective member is located on the outermost surface layer of the solar cell module, and thus, similar to the above-described transparent surface protective member, is required to have a variety of characteristics such as weather resistance and mechanical strength. Therefore, the back surface protective member for solar cell module may be configured of the same material as for the transparent surface protective member. That is, a variety of the above-described materials used as the material for the transparent surface protective member can also be used as a material for the back surface protective member. Particularly, it is possible to preferably use a polyester resin and glass. Since the back surface protective member is not required to allow the penetration of sunlight, transparency required by the transparent surface protective member is not essentially required. Therefore, a reinforcement plate may be attached to increase the mechanical strength of the solar cell module or to prevent strain and warpage caused by the temperature change. Examples of the reinforcement plate that can be preferably used include a steel plate, a plastic plate, a fiberglass reinforced plastic (FRP) plate, and the like.

Furthermore, the encapsulating material for solar cell of the present embodiment may be integrated with the back surface protective member for solar cell module. When the encapsulating material for solar cell and the back surface protective member for solar cell module are integrated together, it is possible to shorten a step of cutting the encapsulating material for solar cell and the back surface protective member for solar cell module to a module size when the module is assembled. In addition, when a step in which the encapsulating material for solar cell and the back surface protective member for solar cell module are separately laid up is replaced by a step in which the encapsulating material for solar cell and the back surface protective member for solar cell module are laid up as an integrated sheet, it is also possible to shorten and remove the lay-up step. In a case in which the encapsulating material for solar cell and the back surface protective member for solar cell module are integrated together, there is no particular limitation with the method for laminating the encapsulating material for solar cell and the back surface protective member for solar cell module. Preferable examples of the lamination method include (i) a method in which the encapsulating material for solar cell and the back surface protective member are co-extruded using a well-known melt extruder such as a casting molder, an extrusion sheet molder, an inflation molder or an injection molder, thereby obtaining a laminate, (ii) a method in which one layer is melted or laminated by heating on the other layer that has been previously molded, thereby obtaining a laminate, and (iii) a method in which a plurality of calendar molders is arrayed, sheets from the respective calendar molders are overlaid and rolled.

In addition, the encapsulating material for solar cell and the back surface protective member may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation, or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited), an ethylene/vinyl acetate-based copolymer, an adhesive resin composition containing what has been described above, or the like) is used.

An adhesive having heat resistance in a range of approximately 120° C. to 150° C. is preferably used as the adhesive, and preferable examples thereof include polyester-based adhesives, and polyurethane-based adhesives. In addition, to improve the adhesiveness between both surfaces, for example, a silane-based coupling treatment, a titanium-based coupling treatment, a corona treatment, a plasma treatment, or the like may be used in at least one layer.

(Solar Cell Element)

There is no particular limitation with the solar cell element used in the solar cell module as long as the solar cell element is capable of generating power using a photovoltaic effect of a semiconductor. As the solar cell element, for example, a silicon (monocrystalline silicon, polycrystalline silicon, or non-crystalline (amorphous) silicon) solar cell, a compound semiconductor group, II-VI group, or the like) solar cell, a wet-type solar cell, an organic semiconductor solar cell, or the like can be used. Among the above-described solar cells, the polycrystalline silicon solar cell is preferred from the viewpoint of the balance between power generation performance and cost.

Both the silicon solar cell element and the compound semiconductor solar cell element have excellent characteristics as the solar cell element, but it is known that both solar cell elements are easily broken due to external stress, impact and the like. Since the encapsulating material for solar cell of the present embodiment has excellent flexibility, the encapsulating material for solar cell has a great effect of absorbing the stress, impact and the like against the solar cell element so as to prevent the breakage of the solar cell element. Therefore, in the solar cell module of the present embodiment, layers made of the encapsulating material for solar cell of the present embodiment are desirably in direct contact with the solar cell element. In addition, when the encapsulating material for solar cell has thermal plasticity, it is possible to relatively easily remove the solar cell element even after the solar cell module has been produced, and the solar cell element obtains excellent recycling properties. Since the ethylene resin composition configuring the encapsulating material for solar cell of the present embodiment has thermal plasticity, the encapsulating material for solar cell also has thermal plasticity as a whole, which is also preferable from the viewpoint of recycling properties.

(Electrode)

There is no particular limitation with the configuration and material of an electrode used in the solar cell module; however, in a specific example, the electrode has a laminate structure of a transparent conductive film and a metal film. The transparent conductive film is made of $SnO_2$, ITO, ZnO, or the like. The metal film is made of at least one metal selected from silver, gold, copper, tin, aluminum, cadmium, zinc, mercury, chromium, molybdenum, tungsten, nickel, or vanadium. The metal film may be solely used or may be used in a form of a complexed alloy. The transparent conductive film and the metal film are formed using a method such as CVD, sputtering, or deposition.

(Method for Manufacturing the Solar Cell Module)

Hereinafter, a method for manufacturing the solar cell module of the present embodiment will be described using a method for manufacturing a crystalline silicon-based solar cell module as an example. The method for manufacturing a crystalline silicon-based solar cell module may include, for example, a step in which the transparent surface protective member (i), the encapsulating material for solar cell of the present embodiment, the solar cell element (cell), the encapsulating material for solar cell (I) or (II) of the present embodiment, and the back surface protective member are laminated in this order, thereby forming a laminate, and (ii) a step in which the obtained laminate is pressurized and heated so as to be integrated.

In the step of laminating the encapsulating material for solar cell (i), a surface of the encapsulating material for solar cell on which an uneven shape (emboss shape) is formed is preferably disposed so as to be on the solar cell element side.

In addition, in the step (ii), the laminate obtained in the step (i) is heated and pressurized using a vacuum laminator or a hot press according to an ordinary method so as to be integrated (encapsulated). Since the encapsulating material for solar cell of the present embodiment has a high cushion property, it is possible to prevent the damage of the solar cell element during the encapsulating. In addition, since the encapsulating material for solar cell of the present embodiment has favorable deaeration properties, the air is not trapped, and it is possible to manufacture high-quality solar cell modules with a favorable yield.

When the laminate is pressurized and heated so as to be integrated (step (ii)), the ethylene/α-olefin-based copolymer included in the encapsulating material for solar cell is cured by crosslinking. In the step (ii), for example, the ethylene/α-olefin-based copolymer may be crosslinked after the encapsulating material for solar cell is temporarily adhered to the solar cell element or the protective member at a temperature at which the crosslinking agent is substantially not decomposed and the encapsulating material for solar cell of the present embodiment is melted; or the α-olefin-based copolymer may be crosslinked at the same time as the adhesion of the encapsulating material for solar cell to the solar cell element or the protective member by heating the laminate at a temperature at which the crosslinking agent is decomposed.

For example, in a case in which the temporary adhesion is carried out before the crosslinking, the laminate is heated for three to six minutes at a temperature in a range of 125° C. to 160° C. and at a vacuum pressure of equal to or less than 10 Torr; and then, pressurization by the atmospheric pressure is carried out for approximately 1 minute to 15 minutes, thereby temporarily adhering the laminate. After that, the ethylene/α-olefin copolymer is crosslinked using, for example, a tray-type batch crosslinking furnace as a tunnel-type continuous crosslinking furnace. At this time, the heating temperature is, generally, set in a range of 130° C. to 155° C. and the heating time is set in a range of, approximately, 20 minutes to 60 minutes.

On the other hand, in a case in which the ethylene/α-olefin-based copolymer is crosslinked at the same time as the adhesion of the encapsulating material for solar cell to the solar cell element or the protective member, the laminate is heated in a vacuum for three to six minutes at a temperature in a range of 145° C. to 170° C. and at a vacuum pressure of equal to or less than 10 Torr. Next, the laminate is pressurized by the atmospheric pressure for approximately 6 minutes to 30 minutes, and the laminate is integrated at the same time as the crosslinking.

In a case in which the encapsulating material for solar cell includes the organic peroxide, the encapsulating material has excellent crosslinking characteristics. Therefore, it is preferable to crosslink the ethylene/α-olefin-based copolymer at the same time as the integration of the laminate from the viewpoint of the productivity and the like of the solar cell module.

In addition, the above-described crosslinking is preferably carried out until the gel fraction of the crosslinked ethylene/α-olefin copolymer becomes 50% to 95%. The gel fraction is more preferably in a range of 50% to 90%, still more preferably in a range of 60% to 90%, and most preferably in a range of 65% to 90%. The gel fraction can be computed using the following method. For example, 1 g of a sample of an encapsulating material sheet is taken from the solar cell module, and Soxhlet extraction is carried out for ten hours in boiling toluene. An extraction liquid is filtered using a stainless steel mesh having 30 meshes, and the mesh is depressurized and dried at 110° C. for eight hours. The weight of a residue remaining on the mesh is measured, and the ratio (%) of the weight of the residue remaining on the mash to the sample amount (1 g) before the treatment is considered as the gel fraction.

When the gel fraction is equal to or more than the above-described lower limit value, the heat resistance of the encapsulating material for solar cell becomes favorable, and it is possible to suppress the degradation of the adhesiveness in, for example, a constant temperature and humidity test at 85° C.×85% RH, a high-strength xenon radiation test at a black panel temperature of 83° C., a heat cycle test at a temperature in a range of −40° C. to 90° C., and a heat resistance test. On the other hand, when the gel fraction is equal to or less than the above-described upper limit value, the encapsulating material for solar cell obtains high flexibility, and the temperature followability in the heat cycle test at a temperature in a range of −40° C. to 90° C. improves, and therefore it is possible to prevent the occurrence of peeling.

(Power Generation Facility)

The solar cell module of the present embodiment is excellent in terms of productivity, power generation efficiency, service life, and the like. Therefore, a power generation facility using the above-described solar cell module is excellent in terms of cost, power generation efficiency, service life, and the like, and has a high practical value. The above-described power generation facility is preferable for long-term indoor and outdoor use so as to be used as an outdoor mobile power supply for camping and the like, which is installed outside houses, or to be used as an auxiliary power supply for automobile batteries.

EXAMPLES

Hereinafter, the present invention will be specifically described based on examples, but the present invention is not limited to the examples.

(1) Measurement Method

[Solid Viscoelasticity in Shear Mode]

The solid viscoelasticity of a 0.5 mm-thick press sheet sample of the encapsulating material for solar cell (I) was measured in a shear mode using a solid viscoelasticity meter (HAAKE ReoStress) in a temperature range of 25° C. (room temperature) to 150° C. at a frequency of 1.0 Hz and a rate of temperature increase of 10° C./minute, and then the press sheet was held at 150° C. for 5 minutes. As a plate, a 20 mmΦ disposable parallel plate was used and strain was controlled at 0.01. The complex viscosity ($\eta^{*2}$) at 150° C., the storage elastic modulus (G') at 150° C., and the minimum value ($\eta^{*1}$) of the complex viscosity were read from measurement profiles.

The minimum value ($\eta^{*3}$) of the complex viscosity of the encapsulating material for solar cell (II) at 150° C. was measured using the same device in a temperature range of 25° C. (room temperature) to 180° C. at a frequency of 0.016 Hz and a rate of temperature increase of 3° C./minute. The minimum value ($\eta^{*3}$) of the complex viscosity of the encapsulating material for solar cell (II) at 150° C. was read from measurement profiles.

[The Content Ratio of the Ethylene Unit and the α-Olefin Unit]

After a solution obtained by heating and melting 0.35 g of a specimen in 2.0 ml of hexachlorobutadiene was filtered using a glass filter (G2), 0.5 ml of deuterated benzene was added, and the mixture was injected into an NMR tube having an inner diameter of 10 mm. The $^{13}$C-NMR was measured at 120° C. using a JNM GX-400-type NMR measurement device manufactured by JEOL, Ltd. The cumulated number was set to equal to or more than 8000 times. The content ratio of the ethylene unit and the content ratios of the α-olefin unit in the copolymer were determined from the obtained $^{13}$C-NMR spectra.

[MFR]

MFR of the ethylene/α-olefin copolymer was measured on the basis of ASTM D1238 under conditions of 190° C. and a load of 2.16 kg.

[Density]

The density of the ethylene/α-olefin copolymer was measured on the basis of ASTM D1505.

[Shore A Hardness]

After the ethylene/α-olefin copolymer was heated at 190° C. for four minutes and pressurized at 10 MPa, the ethylene/α-olefin copolymer was pressurized and cooled at 10 MPa to room temperature for five minutes, thereby obtaining a 3 mm-thick sheet. The shore A hardness of the ethylene/α-olefin copolymer was measured on the basis of ASTM D2240 using the obtained sheet.

[Leakage Test]

A sheet sample of the encapsulating material for solar cell (I) cut into a square size of 100 mm×100 mm was set in the center of a 3.2 mm-thick blue glass plate having a square size of 180 mm×180 mm, a configuration of glass/the sheet sample/a PET back sheet was put into a vacuum laminator (manufactured by NPC Incorporated, LM-110X160S), was placed on a hot plate adjusted to have a temperature of 150° C., was depressurized for 3 minutes, and was heated for 10 minutes, thereby obtaining a laminate. After that, the vertical and horizontal dimensional changes were measured with respect to the original size, and the average value was considered as the leakage amount.

B: less than 6 mm
C: equal to or more than 6 mm and less than 8 mm
D: equal to or more than 8 mm

[Contamination of Laminator]

With respect to a blue glass plate having a thickness of 3.2 mm, a length of 75 mm, and a width of 60 mm, a sheet sample of the encapsulating material for solar cell (I) was cut into sizes of a length of 85 mm and a width of 60 mm. The sheet sample was set to leak 10 mm from the blue glass plate, a configuration of glass/the sheet sample/a PET back sheet was put into a vacuum laminator, was placed on a hot plate adjusted to have a temperature of 150° C., was depressurized for 3 minutes, and was heated for 10 minutes, thereby obtaining a laminate. After that, the peeling state between the sheet sample and the PTFE sheet in the vacuum laminator was observed when the laminate was taken from the vacuum laminator. The ratings are as described below.

B: the PTFE sheet was peeled without any attachment of the sheet sample thereto.
C: the sheet sample was slightly attached, but the PTFE sheet was easily peeled off.
D: the sheet sample was attached, and the PTFE sheet was not peeled off without a scrapper.

[Cracking of Solar Cell Element (Cell)]

A 150 μm-thick silicon crystalline solar cell element was taken from an ingot through cutting, a configuration of a white glass plate/a sheet sample of the encapsulating material for solar cell (I)/the silicon crystalline solar cell element/a sheet sample/a PET back sheet was put into a vacuum laminator, was placed on a hot plate adjusted to have a temperature of 150° C., was depressurized for 3 minutes, and was heated for 10 minutes, thereby obtaining a laminate. The silicon crystalline solar cell element inside the obtained laminate was visually observed, and cracking was assessed.

[Long-Term Reliability]

A sheet sample of the encapsulating material for solar cell (I) cut into sizes of a thickness of 0.5 mm, a length of 75 mm, and a width of 60 mm was put into a vacuum laminator, was depressurized for 3 minutes, and was heated for 10 minutes on a hot plate adjusted to have a temperature of 150° C., thereby obtaining a crosslinked sheet. A long-term reliability test in which the obtained crosslinked sheet was left to stand in a constant temperature and humidity vessel (maker name) having a temperature of 85° C. and a relative humidity of 85% for 2000 hours was carried out and the change ($\Delta YI=YI_2-YI_1$) in the yellow index (YI) before and after the test was measured. Here, the yellow index of the crosslinked sheet before the long-term reliability test is represented by $YI_1$ and the yellow index of the crosslinked sheet after the long-term reliability test is represented by $YI_2$.

B: ΔYI was less than 2
C: ΔYI was equal to or more than 2 and less than 4
D: ΔYI was equal to or more than 4

[Sneaking and Solar Cell Element (Cell) Cracking Test]

With respect to a blue glass plate having a thickness of 3.2 mm, a length of 200 mm, and a width of 200 mm, a sheet sample of the encapsulating material for solar cell (II) was cut into sizes of a length of 200 mm and a width of 200 mm. A 120 μm-thick silicon crystalline solar cell element was cut into a square size of 100 mm×100 mm from an ingot, a configuration of glass/a transparent sheet sample/the silicon crystalline solar cell element/the encapsulating material for a back surface of a solar cell/a PET back sheet was put into a vacuum laminator (manufactured by NPC Incorporated, LM-110X160S), was placed on a hot plate adjusted to have a temperature of 150° C., was depressurized for 3 minutes, and was heated for 10 minutes, thereby obtaining a laminate. After that, the state of the sneaking of the encapsulating material for a back surface of a solar cell into the silicon crystalline solar cell element in the laminate and the solar cell element (the occurrence of cracking) were observed. The ratings of sneaking are as described below.

A: the encapsulating material for a back surface of a solar sheet did not sneak into the solar cell element
B: the encapsulating material for a back surface of a solar sheet sneaked equal to or less than 0.5 mm into the solar cell element C: the encapsulating material for a back surface of a solar sheet sneaked more than 0.5 mm and equal to or less than 1 mm into the solar cell element D: the encapsulating material for a back surface of a solar sheet sneaked more than 1 mm into the solar cell element

[PCT Assessment]

A transparent sheet sample was set between a light-receiving surface-side protective member and the solar cell element, the encapsulating material for a back surface of a solar cell was set between the solar cell element and the back surface-side protective member, a solar cell module was produced using a vacuum laminator, and module assessment was carried out. Regarding the configuration of the module for assessment, a small module in which a monocrystalline cell was used as the solar cell element and 18 cells were connected together in series was used. As the light-receiving surface-side protective member, a 3.2 mm-thick embossed and thermally-treated glass plate of a white float glass plate manufactured by AGC Fabritech Co., Ltd. cut into 24 cm×21 cm was used. As the solar cell element, a cell including a busbar silver electrode on the light-receiving surface side in the center cut into 5 cm×3 cm (monocrystalline cell manufactured by Shinsung Solar energy Corporation) was used.

A copper ribbon electrode including a copper foil coated with eutectic solder on the surface was used as the cell and 18 cells were connected together in series. As the back surface-side protective member, a PET-based back sheet including silica-deposited PET was used, approximately 2 cm-long cuts were made in portions taken out from the cell in a part of the back sheet using a cutter knife, a positive terminal and a negative terminal of the cell in which 18 cells were connected together in series were taken out, and the components were laminated using a vacuum laminator (manufactured by NPC Incorporated, LM-110X160S) at a hot plate temperature of 150° C. for a vacuum time of 3 minutes and a pressurization time of 15 minutes. After that, the encapsulating sheet and the back sheet which leaked from the glass were cut, an end surface encapsulating sheet was supplied to the glass edge so as to attach an aluminum frame, then, an RTV silicone was supplied to the cut portion of the terminal portions taken out from the back sheet, and was cured. The obtained module was injected into a pressure cooker tester (abbreviation: PCT) (manufactured by Hirayama Manufacturing Corporation, HASTEST PC-422R7) of 121° C.×100% RH for 400 hours. For the module before and after the injection, the IV characteristics were assessed using a xenon light source having a light intensity distribution of air mass (AM) 1.5 class A. For the IV assessment, a PVS-116i-S manufactured by Nisshinbo Mechatronics Inc. was used. The IV characteristics were classified as described below.

Regarding the maximum output power $P_{max}$ of the IV characteristics after the PCT test, compared with the initial value, a decrease in the output power is less than 2%: A
a decrease in the output power is less than 5%: B
a decrease in the output power is less than 10%: C
a decrease in the output power is more than 10%: D

[Glass Adhesion Strength]

A transparent glass plate which was the front surface-side transparent protective member for a solar cell and a 500 μm-thick encapsulating material for a back surface of a solar cell were laminated together, were put into a vacuum laminator (manufactured by NPC Incorporated, LM-110X160S), were placed on a hot plate adjusted to have a temperature of 150° C., was depressurized for 3 minutes, and was heated for 15 minutes, thereby producing a sample for adhesion strength which was a laminate of the transparent glass plate/the encapsulating material for a back surface of a solar cell. The layer of the encapsulating material for a back surface of a solar cell in this sample for adhesion strength was cut at a width of 15 mm, and the peeling strength (glass adhesion strength) from glass was measured with 180-degree peeling. For the measurement, a tensile tester (trade name "Instron 1123") manufactured by Illinois Tool Works Inc. was used. In the 180-degree peeling, the measurement was carried out at span intervals of 30 mm, a tensile rate of 30 mm/minute, and a temperature of 23° C., and the average value obtained from three measurements was employed.

(2) Synthesis of Ethylene/α-Olefin Copolymer (A)

Synthesis Example 1

A toluene solution of methylaluminoxane was supplied as a co-catalyst at a rate of 8 mmol/hr, a hexane slurry of bis(1,3-dimethylcyclopentadienyl)zirconium dichloride and a hexane solution of triisobutylaluminum were supplied at rates of 0.025 mmol/hr and 0.6 mmol/hr respectively as main catalysts to one supply opening of a continuous polymerization vessel having stirring blades and an inner volume of 50 L, and furthermore, dehydrated and purified normal hexane was continuously supplied so that the total of the catalyst solution and a polymerization solvent reached 20 L/hr. At the same time, ethylene, 1-butene, and hydrogen were continuously supplied at rates of 3 kg/hr, 14 kg/hr, and 1.5 NL/hr respectively to another supply opening of the polymerization vessel, and continuous solution polymerization was carried out under conditions of a polymerization temperature of 90° C., a total pressure of 3 MPaG, and a retention time of 1.0 hour.

A normal hexane/toluene solution mixture of the ethylene/α-olefin copolymer generated in the polymerization vessel was continuously exhausted through an exhaust opening provided in the bottom portion of the polymerization vessel, and was guided to a coupling pipe in which a jacket portion was heated using 3 kg/cm² to 25 kg/cm² steam so that the normal hexane/toluene solution mixture of the ethylene/α-olefin copolymer reached a temperature in a range of 150° C. to 190° C. Meanwhile, a supply opening through which methanol that was a catalyst-devitalizing agent was injected was provided immediately before the coupling pipe, and methanol was injected at a rate of approximately 0.75 L/hr so as to combine with the normal hexane/toluene solution mixture of the ethylene/α-olefin copolymer.

The normal hexane/toluene solution mixture of the ethylene/α-olefin copolymer maintained at approximately 190° C. in the steam jacket-equipped coupling pipe was continuously sent to a flash chamber by adjusting the degree of the opening of a pressure control valve provided at the terminal portion of the coupling pipe so as to maintain approximately 4.3 MPaG. Meanwhile, when the normal hexane/toluene solution mixture was sent to the flash chamber, the solution temperature and the degree of the opening of the pressure-adjusting valve were set so that the pressure in the flash chamber was maintained at approximately 0.1 MPaG and the temperature of a vapor portion in the flash chamber was maintained at approximately 180° C. After that, a strand was cooled in a water vessel through a single screw extruder in which the die temperature was set to 180° C., and the strand was cut using a pellet cutter, thereby obtaining an ethylene/α-olefin copolymer in a pellet form. The yield was 2.0 kg/hr. The properties are described in Table 2.

Synthesis Examples 2 to 12

A variety of supply amounts were adjusted on the basis of the polymerization conditions in Synthesis Example 1, thereby obtaining ethylene/α-olefin copolymers. A variety of property values of the copolymers are described in Tables 2 and 3. In these tables, C4 represents 1-butene and C8 represents 1-octene.

Synthesis Example 13

[Preparation of Solid Catalyst Components]

Solid catalyst components including dimethylsilylenebis (3-methylcyclopentadienyl)zirconium dichloride which was the metallocene compound were adjusted using the method described in Japanese Unexamined Patent Publication No. 9-328520. The content of zirconium per gram was 2.3 mg.

[Preparation of Preliminary Polymerization Catalyst]

Similarly, a preliminary polymerization catalyst made up of 1-hexene and ethylene was obtained using 4 g of the solid catalyst obtained above and the method described in Japanese Unexamined Patent Publication No. 9-328520. A preliminary polymerization catalyst in which the content of zirconium per gram of the solid catalyst was 2.2 mg and 3 g of polyethylene had been preliminarily polymerized was obtained.

788 mL of dehydrated and purified hexane was loaded into a stainless steel autoclave which was sufficiently substituted by nitrogen and had an internal volume of 2 L, and the inside of the system was substituted by a gas mixture of ethylene and hydrogen (hydrogen content: 0.8 mol %). Next, the inside of the system was set to 60° C., and 1.5 mmol of triisobutylaluminum, 212 ml of 1-hexene, and the preliminary polymerization catalyst prepared as described above were added as much as 0.015 mg atom in terms of zirconium atom. After that, a gas mixture of ethylene and hydrogen having the same composition as described above was introduced, and polymerization was initiated at a total pressure set to 3 MPaG. After that, only the gas mixture was resupplied, the total pressure was held at 3 MPaG, and polymerization was carried out at 70° C. for 1.5 hours. After the completion of the polymerization, the polymer was filtered and dried at 80° C. for one night, thereby obtaining 90 g of an ethylene-based polymer.

An ethylene-based polymer obtained by repeating the above-described polymerization was made into a pellet of the ethylene-based polymer in a monoaxial extruder (with a screw diameter of 20 mmΦ, L/D=28) manufactured by TPIC Co., Ltd. under conditions of a dice temperature of 190° C. The obtained ethylene-based polymer had a density of 0.898 g/cm$^3$ and an MFR of 2.1 g/10 minutes.

(3) Manufacturing and Assessment of Sheet of Encapsulating Material for Solar Cell (I)

Example 1a

With respect to 100 parts by weight of the ethylene/α-olefin copolymer of Synthesis Example 2, 0.5 parts by weight of γ-methacryloxy propyl trimethoxysilane as the silane coupling agent, 0.6 parts by weight of t-butylperoxy-2-ethylhexyl carbonate having a one-minute half-life temperature of 166° C. as the organic peroxide 1, 1.2 parts by weight of triallyl isocyanurate as the crosslinking aid, 0.4 parts by weight of 2-hydroxy-4-normal-octyloxybenzophenone as the ultraviolet absorber, 0.2 parts by weight of bis(2,2,6,6-tetramethyl-4-piperidyl)sebacate as a radical capturing agent, 0.05 parts by weight of tris(2,4-di-t-butylphenyl)phosphite as the heat-resistant stabilizer 1, and 0.1 parts by weight of octadecyl-3-(3,5-di-tert-butyl-4-hydroxyphenyl)propionate as the heat-resistant stabilizer 2 were blended in.

The ethylene-based composition was prepared in a lab blast mill manufactured by Toyo Seiki Co., Ltd., and was kneaded at a temperature of 100° C. and a rotation speed of 30 rpm for 5 minutes. Next, the composition was pressed for 3 minutes at 0 MPa and for 2 minutes at 10 MPa at 100° C., and was pressed in a cooling press for 3 minutes at 10 MPa, thereby obtaining a 0.5 mm-long sheet. A variety of assessment results of the obtained sheet are described in Table 4.

Examples 2a and 3a

A sheet (a sheet of the encapsulating material for solar cell) was obtained in the same manner as in Example 1a except for the fact that the ethylene-based composition was blended as described in Table 4. A variety of assessment results of the obtained sheet are described in Table 4.

Comparative Examples 1a to 4a

A sheet (a sheet of the encapsulating material for solar cell) was obtained in the same manner as in Example 1a except for the fact that the ethylene-based composition was blended as described in Table 4. A variety of assessment results of the obtained sheet are described in Table 4.

TABLE 2

|  | Synthesis example 1 | Synthesis example 2 | Synthesis example 3 | Synthesis example 4 | Synthesis example 5 | Synthesis example 6 |
|---|---|---|---|---|---|---|
| α-olefin type | C4 | C4 | C8 | C4 | C8 | C4 |
| α-olefin (mol %) | 13 | 18 | 11 | 14 | 16 | 14 |
| Density (g/cm$^3$) | 0.873 | 0.865 | 0.884 | 0.870 | 0.865 | 0.870 |
| MFR (g/10 min) | 4.5 | 1.8 | 6.5 | 1.0 | 0.3 | 0.05 |
| A hardness | 73 | 60 | 84 | 70 | 60 | 70 |

TABLE 3

|  | Synthesis example 7 | Synthesis example 8 | Synthesis example 9 | Synthesis example 10 | Synthesis example 11 | Synthesis example 12 |
|---|---|---|---|---|---|---|
| α-olefin type | C8 | C4 | C4 | C4 | C8 | C4 |
| α-olefin (mol %) | 11 | 14 | 18 | 11 | 11 | 14 |
| Density (g/cm$^3$) | 0.884 | 0.870 | 0.865 | 0.884 | 0.884 | 0.870 |
| MFR (g/10 min) | 8.5 | 1.8 | 4.0 | 7.6 | 10.0 | 20.0 |
| A hardness | 84 | 70 | 60 | 84 | 84 | 70 |

Comparative Example 5a

A sheet (a sheet of the encapsulating material for solar cell) was obtained in the same manner as in Example 1a except for the fact that the ethylene-based composition was blended as described in Table 4, and 0.8 parts by weight of 2,5-dimethyl-2,5-di(t-butylperoxy)hexane having a one-minute half-life temperature of 181° C. as the organic peroxide 2 and 0.1 parts by weight of the heat-resistant stabilizer 1 were blended. A variety of assessment results of the obtained sheet are described in Table 4.

none as the ultraviolet absorber, 0.2 parts by weight of bis(2,2,6,6-tetramethyl-4-piperidyl)sebacate as a radical capturing agent, 0.05 parts by weight of tris(2,4-di-tert-butylphenyl)phosphite as the heat-resistant stabilizer 1, and 0.1 parts by weight of octadecyl-3-(3,5-di-tert-butyl-4-hydroxyphenyl)propionate as the heat-resistant stabilizer 2 were blended in.

The ethylene-based resin composition was prepared in a lab blast mill manufactured by Toyo Seiki Co., Ltd., and was kneaded at a temperature of 100° C. and a rotation speed of 30 rpm for 5 minutes. Next, the obtained ethylene-based

TABLE 4

| | Unit | Example 1a | Example 2a | Example 3a | Comparative Example 1a | Comparative Example 2a | Comparative Example 3a | Comparative Example 4a | Comparative Example 5a |
|---|---|---|---|---|---|---|---|---|---|
| [Blending] ethylene/α-olefin copolymer (A) | Parts by weight | | | | | | | | |
| Synthesis Example 1 | | | | | 100 | | | | |
| Synthesis Example 2 | | 100 | | | | | | | |
| Synthesis Example 3 | | | | | | 100 | | | |
| Synthesis Example 4 | | | 100 | | | | | | 100 |
| Synthesis Example 5 | | | | 100 | | | | | |
| Synthesis Example 6 | | | | | | | 100 | | |
| Synthesis Example 7 | | | | | | | | 100 | |
| Silane coupling agent | Parts by weight | 0.5 | 0.5 | 0.5 | 0.5 | 0.5 | 0.5 | 0.5 | 0.5 |
| Organic peroxide 1 | Parts by weight | 0.6 | 0.6 | 0.6 | 0.6 | 0.35 | 0.6 | 0.35 | 0 |
| Organic peroxide 2 | Parts by weight | 0 | 0 | 0 | 0 | 0 | 0 | 0 | 0.8 |
| Crosslinking aid | Parts by weight | 1.2 | 1.2 | 1.2 | 1.2 | 1.2 | 1.2 | 1.2 | 1.2 |
| Ultraviolet absorber | Parts by weight | 0.4 | 0.4 | 0.4 | 0.4 | 0.4 | 0.4 | 0.4 | 0.4 |
| Radical capturing agent | Parts by weight | 0.2 | 0.2 | 0.2 | 0.2 | 0.2 | 0.1 | 0.1 | 0.2 |
| Heat-resistant stabilizer 1 | Parts by weight | 0.05 | 0.1 | 0.1 | 0.05 | 0.1 | 0.1 | 0.1 | 0.1 |
| Heat-resistant stabilizer 2 | Parts by weight | 0.1 | 0.1 | 0.1 | 0.1 | 0.1 | 0.1 | 0.1 | 0.1 |
| [Viscoelasticity in shear mode] Minimum value ($\eta^{*1}$) of complex viscosity | [Pa · s] | $7.2 \times 10^3$ | $9.8 \times 10^3$ | $1.9 \times 10^4$ | $4.3 \times 10^3$ | $2.5 \times 10^3$ | $4.8 \times 10^4$ | $2.2 \times 10^3$ | $6.4 \times 10^3$ |
| Temperature at which the minimum value ($\eta^{*1}$) of complex viscosity is obtained | [° C.] | 128 | 129 | 130 | 128 | 135 | 129 | 135 | 143 |
| Complex viscosity ($\eta^{*2}$) (150° C.) | [Pa · s] | $5.2 \times 10^4$ | $6.0 \times 10^4$ | $8.0 \times 10^4$ | $4.1 \times 10^4$ | $2.7 \times 10^4$ | $1.3 \times 10^5$ | $1.2 \times 10^4$ | $1.7 \times 10^4$ |
| Storage elastic modulus (G') (150° C.) | [Pa] | $3.2 \times 10^5$ | $4.1 \times 10^5$ | $6.1 \times 10^5$ | $2.8 \times 10^5$ | $1.4 \times 10^5$ | $8.5 \times 10^5$ | $7.5 \times 10^4$ | $8.9 \times 10^4$ |
| [Assessment] Leakage test | [—] | B | B | B | C | C | B | D | D |
| Contamination of laminator | [—] | B | B | B | C | C | B | D | C |
| Cell cracking | [—] | No | No | No | No | No | Yes | No | No |
| Long-term reliability | [—] | B | B | B | B | B | B | B | C |

As is clear from Table 4, the encapsulating material for solar cell (I) having a minimum value ($\eta^{*1}$) of the complex viscosity, a temperature at which the minimum value was obtained, and a complex viscosity ($\eta^{*2}$) at 150° C. satisfying the scope of Claim 1 exhibit excellent performance in all aspects of the leakage test, the apparatus contamination, the cell cracking, and the long-term reliability test.

(4) Preparation of Transparent Sheet Sample for Sneaking and Cell Cracking Test

Manufacturing Example 1

With respect to 100 parts by weight of the ethylene/α-olefin copolymer of Synthesis Example 12, 0.6 parts by weight of t-butylperoxy-2-ethylhexyl carbonate having a one-minute half-life temperature of 166° C. as the organic peroxide, 0.5 parts by weight of γ-methacryloxy propyl trimethoxysilane as the silane coupling agent, 1.2 parts by weight of triallyl isocyanurate as the crosslinking aid, 0.4 parts by weight of 2-hydroxy-4-normal-octyloxybenzopheresin composition was pressed for 3 minutes at 0 MPa and for 2 minutes at 10 MPa at 100° C., and was pressed in a cooling press for 3 minutes at 10 MPa, thereby obtaining a 0.5 mm-long sheet. The minimum values ($\eta^{*0}$) of the complex viscosity of the sheet observed at a temperature in a range of 100° C. to lower than 135° C., which were measured through solid viscoelasticity measurement under conditions of a measurement temperature range of 25° C. (room temperature) to 180° C., a frequency of 0.016 Hz, a rate of temperature increase of 3° C./minute, and a shear mode, are described in Table 5.

Manufacturing Examples 2 and 3

Sheets were obtained in the same manner as in Manufacturing Example 1 except for the fact that the ethylene-based resin composition was blended as described in Table 5. The results are described in Table 5.

TABLE 5

|  | Unit | Manufacturing Example 1 | Manufacturing Example 2 | Manufacturing Example 3 |
|---|---|---|---|---|
| [Blending] ethylene/α-olefin copolymer (A) | Parts by weight |  |  |  |
| Synthesis Example 12 |  | 100 |  |  |
| Synthesis Example 10 |  |  | 100 |  |
| Synthesis Example 4 |  |  |  | 100 |
| Silane coupling agent | Parts by weight | 0.5 | 0.5 | 0.5 |
| Organic peroxide | Parts by weight | 0.6 | 0.6 | 0.6 |
| Crosslinking aid | Parts by weight | 1.2 | 1.2 | 1.2 |
| Ultraviolet absorber | Parts by weight | 0.4 | 0.4 | 0.4 |
| Radical capturing agent | Parts by weight | 0.2 | 0.2 | 0.2 |
| Heat-resistant stabilizer 1 | Parts by weight | 0.05 | 0.05 | 0.1 |
| Heat-resistant stabilizer 2 | Parts by weight | 0.1 | 0.1 | 0.1 |
| Minimum value ($\eta^{*0}$) of complex viscosity | [Pa · s] | $1.4 \times 10^3$ | $4.3 \times 10^3$ | $4.6 \times 10^4$ |

(5) Manufacturing of Sheet of Encapsulating Material for Solar Cell (II)

Example 1b

With respect to 100 parts by weight of the ethylene/α-olefin copolymer of Synthesis Example 4, 0.4 parts by weight of t-butylperoxy-2-ethylhexyl carbonate having a one-minute half-life temperature of 166° C. as the organic peroxide, 5 parts by weight of titanium oxide (the content of sulfate ions measured through ion chromatography; 45 weight ppm) as the colorant, 0.5 parts by weight of γ-methacryloxy propyl trimethoxysilane as the silane coupling agent, 1.2 parts by weight of triallyl isocyanurate as the crosslinking aid, 0.4 parts by weight of 2-hydroxy-4-normal-octyloxybenzophenone as the ultraviolet absorber, 0.2 parts by weight of bis(2,2,6,6-tetramethyl-4-piperidyl)sebacate as a radical capturing agent, 0.1 parts by weight of tris(2,4-di-tert-butylphenyl)phosphite as the heat-resistant stabilizer 1, and 0.1 parts by weight of octadecyl-3-(3,5-di-tert-butyl-4-hydroxyphenyl)propionate as the heat-resistant stabilizer 2 were blended in.

The ethylene-based resin composition was prepared in a lab blast mill manufactured by Toyo Seiki Co., Ltd., and was kneaded at a temperature of 100° C. and a rotation speed of 30 rpm for 5 minutes. Next, the obtained ethylene-based resin composition was pressed for 3 minutes at 0 MPa and for 2 minutes at 10 MPa at 100° C., and was pressed in a cooling press for 3 minutes at 10 MPa, thereby obtaining a 0.5 mm-long sheet. A variety of assessment results of the obtained sheet are described in Table 6.

Examples 2b to 7b

Sheets (sheets of the encapsulating material for a back surface of a solar cell) were obtained in the same manner as in Example 1b except for the fact that the ethylene-based resin composition was blended as described in Table 6. A variety of assessment results of the obtained sheet are described in Table 6.

Comparative Examples 1b and 2b

Sheets (sheets of the encapsulating material for a back surface of a solar cell) were obtained in the same manner as in Example 1b except for the fact that the ethylene-based resin composition was blended as described in Table 6. A variety of assessment results of the obtained sheet are described in Table 6.

Comparative Example 3b 2 parts by weight of vinyl trimethoxysilane and 0.1 parts by weight of dicumyl peroxide as the organic peroxide were mixed with 98 parts by weight of the ethylene-based polymer obtained in Synthesis Example 13, were melted and stirred at 200° C., thereby obtaining silane-denatured low-density polyethylene (in some cases, referred to as silane-denatured LL).

Next, 5 parts by weight of titanium oxide as the colorant was blended with 100 parts by weight of the silane-denatured low-density polyethylene, was prepared in a lab blast mill manufactured by Toyo Seiki Co., Ltd., and was kneaded at a temperature of 200° C. and a rotation speed of 50 rpm for 5 minutes. The obtained ethylene-based resin composition was pressed for 3 minutes at 0 MPa and for 2 minutes at 10 MPa at 200° C., and then was pressed in a cooling press for 3 minutes at 10 MPa, thereby obtaining a 0.5 mm-long sheet. A variety of assessment results of the obtained sheet are described in Table 6.

The complex viscosity ($\eta^*$) of the sheet obtained in Comparative Example 3b continuously decreased as the temperature increased in a measurement temperature range of 25° C. to 180° C. Therefore, the minimum viscosity of the complex viscosity ($\eta^{*3}$) of the sheet obtained in Comparative Example 3b was not observed.

TABLE 6

|  | Unit | Example 1b | Example 2b | Example 3b | Example 4b | Example 5b |
|---|---|---|---|---|---|---|
| [Blending] ethylene/α-olefin copolymer (A) | Parts by weight |  |  |  |  |  |
| Synthesis Example 4 |  | 100 |  |  |  |  |
| Synthesis Example 5 |  |  | 100 |  |  |  |
| Synthesis Example 6 |  |  |  |  |  |  |
| Synthesis Example 8 |  |  |  | 100 | 100 |  |
| Synthesis Example 9 |  |  |  |  |  | 100 |
| Synthesis Example 10 |  |  |  |  |  |  |
| Synthesis Example 11 |  |  |  |  |  |  |
| Silane-denatured LL | Parts by weight |  |  |  |  |  |
| Silane coupling agent | Parts by weight | 0.5 | 0.5 | 0.5 | 0.5 | 0.5 |

TABLE 6-continued

| | | | | | | |
|---|---|---|---|---|---|---|
| Organic peroxide | Parts by weight | 0.4 | 0.4 | 0.4 | 0.6 | 0.4 |
| Titanium oxide | Parts by weight | 5 | 5 | 5 | 5 | 5 |
| Crosslinking aid | Parts by weight | 1.2 | 1.2 | 1.2 | 1.2 | 1.2 |
| Ultraviolet absorber | Parts by weight | 0.4 | 0.4 | 0.4 | 0.4 | 0.4 |
| Radical capturing agent | Parts by weight | 0.2 | 0.2 | 0.2 | 0.2 | 0.2 |
| Heat-resistant stabilizer 1 | Parts by weight | 0.1 | 0.1 | 0.05 | 0.05 | 0.05 |
| Heat-resistant stabilizer 2 | Parts by weight | 0.1 | 0.1 | 0.1 | 0.1 | 0.1 |
| [Viscoelasticity in shear mode] Minimum value ($\eta^{*3}$) of complex viscosity | [Pa · s] | $4.6 \times 10^4$ | $2.0 \times 10^5$ | $1.8 \times 10^4$ | $2.2 \times 10^4$ | $9.8 \times 10^3$ |
| Log($\eta^{*3}/\eta^{*0}$) | | 1.51 | 2.15 | 2.11 | 0.67 | 0.85 |
| [Assessment] Transparent sheet sample | | Manufacturing Example 1 | Manufacturing Example 1 | Manufacturing Example 1 | Manufacturing Example 2 | Manufacturing Example 1 |
| Sneaking of encapsulating material for back surface of solar cell | | A | A | A | A | B |
| Cracking of solar cell element | | No | No | No | No | No |

| | Example 6b | Example 7b | Comparative Example 1b | Comparative Example 2b | Comparative Example 3b |
|---|---|---|---|---|---|
| [Blending] ethylene/α-olefin copolymer (A) | | | | | |
| Synthesis Example 4 | | | | | |
| Synthesis Example 5 | | | | | |
| Synthesis Example 6 | | | 100 | | |
| Synthesis Example 8 | | | | | |
| Synthesis Example 9 | | | | | |
| Synthesis Example 10 | 100 | 100 | | | |
| Synthesis Example 11 | | | | 100 | |
| Silane-denatured LL | | | | | 100 |
| Silane coupling agent | 0.5 | 0.5 | 0.5 | 0.5 | |
| Organic peroxide | 0.6 | 0.6 | 0.4 | 0.6 | |
| Titanium oxide | 10 | 5 | 5 | 5 | 5 |
| Crosslinking aid | 1.2 | 1.2 | 1.2 | 1.2 | |
| Ultraviolet absorber | 0.4 | 0.4 | 0.4 | 0.4 | |
| Radical capturing agent | 0.2 | 0.2 | 0.1 | 0.1 | |
| Heat-resistant stabilizer 1 | 0.1 | 0.1 | 0.1 | 0.1 | |
| Heat-resistant stabilizer 2 | 0.1 | 0.1 | 0.1 | 0.1 | |
| [Viscoelasticity in shear mode] Minimum value ($\eta^{*3}$) of complex viscosity | $4.7 \times 10^3$ | $4.3 \times 10^3$ | $2.0 \times 10^6$ | $2.0 \times 10^3$ | — |
| Log($\eta^{*3}/\eta^{*0}$) | 0.53 | −1.03 | 3.15 | 0.15 | |
| [Assessment] Transparent sheet sample | Manufacturing Example 1 | Manufacturing Example 3 | Manufacturing Example 1 | Manufacturing Example 1 | Manufacturing Example 1 |
| Sneaking of encapsulating material for back surface of solar cell | C | C | B | D | D |
| Cracking of solar cell element | No | No | Slightly cracked | No | Slightly cracked |

As is clear from Table 6, the encapsulating material for solar cell (II) having a minimum value ($\eta^{*3}$) of the complex viscosity satisfying the numerical range defined in Claim 6 exhibits excellent performance in terms of the sneaking of the encapsulating material and the cell cracking test. In addition, as is clear from the comparison between the assessment results of Example 3b and the assessment results of Example 4b and the comparison between the assessment results of Example 6b and the assessment results of Example 7b, as long as the minimum value ($\eta^{*3}$) of the complex viscosity of the encapsulating material for solar cell (II) and the minimum value ($\eta^{*0}$) of the complex viscosity of the encapsulating material for solar cell (I) used as a pair in the module (in Table 6, referred to as "transparent sheet sample") satisfy the relationship formula defined in Claim 13, the fact that the sneaking of the encapsulating material for solar cell (II) or element cracking can be prevented is considered to be a phenomenon deserving attention.

Examples described below are the investigation results of the influence of the content of sulfate ions included in the colorant on sneaking and element cracking and the influence of output change after the PCT test.

Example 1c

With respect to 100 parts by weight of the ethylene/α-olefin copolymer of Synthesis Example 8, 0.4 parts by weight of t-butylperoxy-2-ethylhexyl carbonate having a one-minute half-life temperature of 166° C. as the organic peroxide, 20 parts by weight of titanium oxide 1 (the content of sulfate ions; 15 weight ppm) as the colorant, 0.5 parts by weight of γ-methacryloxy propyl trimethoxysilane as the silane coupling agent, 1.2 parts by weight of triallyl isocyanurate as the crosslinking aid, 0.4 parts by weight of 2-hydroxy-4-normal-octyloxybenzophenone as the ultraviolet absorber, 0.2 parts by weight of bis(2,2,6,6-tetramethyl-4-piperidyl)sebacate as a radical capturing agent, 0.05 parts by weight of tris(2,4-di-tert-butylphenyl)phosphite as the heat-resistant stabilizer 1, and 0.1 parts by weight of octadecyl-3-(3,5-di-tert-butyl-4-hydroxyphenyl)propionate as the heat-resistant stabilizer 2 were blended in.

The ethylene-based resin composition was prepared in a lab blast mill manufactured by Toyo Seiki Co., Ltd., and was kneaded at a temperature of 100° C. and a rotation speed of 30 rpm for 5 minutes. Next, the obtained ethylene-based resin composition was pressed for 3 minutes at 0 MPa and for 2 minutes at 10 MPa at 100° C., and was pressed in a cooling press for 3 minutes at 10 MPa, thereby obtaining a 0.5 mm-long sheet. A variety of assessment results of the obtained sheet are described in Table 7.

Examples 2c to 5c

A sheet (a sheet of the encapsulating material for a back surface of a solar cell) was obtained in the same manner as in Example 1c except for the fact that the ethylene-based resin composition was blended as described in Table 7. A variety of assessment results of the obtained sheet are described in Table 7.

In addition, it was found that, as the content of titanium oxide in the encapsulating material for a back surface of a solar cell increases, a tendency of a decrease in the adhesion strength with glass appears, and the adhesion strength abruptly decreases when the content of titanium oxide exceeds 20 parts by weight.

The present application respectively claims priority on the basis of Japanese Patent Application No. 2012-255278, filed on Nov. 21, 2012, Japanese Patent Application No. 2012-278975, filed on Dec. 21, 2012, Japanese Patent Application No. 2013-050382, filed on Mar. 13, 2013, the contents of which are incorporated herein by reference.

Hereinafter, examples of reference embodiment will be additionally described.

[A1] An encapsulating material for a back surface of a solar cell including an ethylene/α-olefin copolymer, a colorant, and an organic peroxide, in which a minimum viscosity of a complex viscosity ($\eta^*$) of the encapsulating material for a back surface of a solar cell in solid viscoelasticity measurement in a measurement temperature range of 25° C. to 180° C. at a frequency of 0.016 Hz and a rate of temperature increase of 3° C./minute in a shear mode is in a range of $4.0 \times 10^3$ Pa·s to $1.0 \times 10^6$ Pa·s.

[A2] The encapsulating material for a back surface of a solar cell according to [A1], in which the ethylene/α-olefin copolymer satisfies the following requirement a1):

a1) MFR, which is based on ASTM D1238 and measured under conditions of a temperature of 190° C. and a load of 2.16 kg, is in a range of 0.1 g/10 minutes to 8.0 g/10 minutes;

TABLE 7

| | Unit | Example 1c | Example 2c | Example 3c | Example 4c | Example 5c |
|---|---|---|---|---|---|---|
| [Blending] | Parts by weight | | | | | |
| ethylene/α-olefin copolymer (A) | | | | | | |
| Synthesis Example 8 | | 100 | 100 | | 100 | 100 |
| Synthesis Example 9 | | | | 100 | | |
| Silane coupling agent | Parts by weight | 0.5 | 0.5 | 0.5 | 0.5 | 0.5 |
| Organic peroxide | Parts by weight | 0.4 | 0.4 | 0.4 | 0.4 | 0.4 |
| Titanium oxide 1 (sulfate ion: 15 weight ppm) | Parts by weight | 20 | | | | 25 |
| Titanium oxide 2 (sulfate ion: 150 weight ppm) | Parts by weight | | 5 | | | |
| Titanium oxide 3 (sulfate ion: 45 weight ppm) | Parts by weight | | | 2 | 25 | |
| Crosslinking aid | Parts by weight | 1.2 | 1.2 | 1.2 | 1.2 | 1.2 |
| Ultraviolet absorber | Parts by weight | 0.4 | 0.4 | 0.4 | 0.4 | 0.4 |
| Radical capturing agent | Parts by weight | 0.2 | 0.2 | 0.2 | 0.1 | 0.1 |
| Heat-resistant stabilizer 1 | Parts by weight | 0.05 | 0.05 | 0.05 | 0.1 | 0.1 |
| Heat-resistant stabilizer 2 | Parts by weight | 0.1 | 0.1 | 0.1 | 0.1 | 0.1 |
| [Viscoelasticity in shear mode] Minimum viscosity ($\eta^{*3}$) of complex viscosity | [Pa·s] | $4.1 \times 10^4$ | $1.8 \times 10^4$ | $9.8 \times 10^3$ | $4.5 \times 10^4$ | $4.4 \times 10^4$ |
| Log($\eta^{*3}/\eta^{*0}$) | | 1.47 | 0.58 | 0.36 | −0.01 | −0.02 |
| [Concentration of sulfate ions in encapsulating material for back surface] | [weight ppm] | 2.4 | 7.0 | 0.9 | 8.8 | 2.9 |
| [Assessment] Transparent sheet sample | | Manufacturing example 1 | Manufacturing example 2 | Manufacturing example 2 | Manufacturing example 3 | Manufacturing example 3 |
| Sneaking of encapsulating material for back surface of solar cell | | A | A | A | A | A |
| Cracking of solar cell element | | No | No | No | No | No |
| Decrease in power after 400 hours from PCT | [%] | B | C | A | D | B |
| Adhesion strength with glass | [N/cm] | 12 | 18 | 20 | 9 | 9 |

It was found from Table 7 that, as the concentration of sulfate ions in the encapsulating material for solar cell (II), that is, the encapsulating material for a back surface of a solar cell increases, a tendency of a decrease in the output after 400 hours from the PCT test of the solar cell module appears, and the output abruptly decreases when the concentration of sulfate ions exceeds 8 weight ppm.

[A3] The encapsulating material for a back surface of a solar cell according to [A1] or [A2], in which the ethylene/α-olefin copolymer satisfies the following requirements a2) to a4):

a2) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[A4] The encapsulating material for a back surface of a solar cell according to any one of [A1] to [A3], in which a one-minute half-life temperature of the organic peroxide is in a range of 100° C. to 170° C., and a content of the organic peroxide in the encapsulating material for a back surface of a solar cell is in a range of 0.1 parts by weight to 3 parts by weight with respect to 100 parts by weight of the ethylene/α-olefin copolymer.

[A5] The encapsulating material for a back surface of a solar cell according to any one of [A1] to [A4], in which the colorant is at least one selected from a group consisting of organic pigments, dyes, and inorganic fillers.

[A6] The encapsulating material for a back surface of a solar cell according to any one of [A1] to [A5], in which the colorant includes an inorganic filler, and the inorganic filler is at least one selected from a group consisting of natural mica, synthetic mica, titanium oxide, aluminum oxide, calcium carbonate, talc, clay, magnesium carbonate, kaolinite, and diatomite.

[A7] The encapsulating material for a back surface of a solar cell according to any one of [A1] to [A6], in which a content of the colorant in the encapsulating material for a back surface of a solar cell is in a range of 1 part by weight to 20 parts by weight with respect to 100 parts by weight of the ethylene/α-olefin copolymer.

[A8] The encapsulating material for a back surface of a solar cell according to any one of [A1] to [A7], in which a total light transmittance in a wavelength range of 430 nm to 800 nm is equal to or less than 10%.

[A9] The encapsulating material for a back surface of a solar cell according to any one of [A1] to [A8], in which the encapsulating material has a sheet shape.

[A10] A solar cell module including:

a transparent surface protective member;

a back surface protective member;

a solar cell element; and an encapsulating layer that encapsulates the solar cell element between the transparent surface protective member and the back surface protective member, in which the encapsulating layer is formed by heating and pressing the encapsulating material for a back surface of a solar cell according to any one of [A1] to [A9] and an encapsulating material for a front surface of a solar cell.

[B1] An encapsulating material for solar cell including an ethylene/α-olefin copolymer and an organic peroxide having a one-minute half-life temperature in a range of 100° C. to 170° C., in which a complex viscosity (η*) of the encapsulating material for solar cell at 150° C. is in a range of $2.0 \times 10^4$ Pa·s to $1.0 \times 10^5$ Pa·s after a solid viscoelasticity of the encapsulating material for solar cell is measured under conditions of a measurement temperature range of 25° C. to 150° C., a frequency of 1.0 Hz, a rate of temperature increase of 10° C./minute, and a shear mode.

[B2] The encapsulating material for solar cell according to [B1], in which a storage elastic modulus (G') of the encapsulating material for solar cell at 150° C. is in a range of $1.0 \times 10^5$ Pa to $7.0 \times 10^5$ Pa after the solid viscoelasticity of the encapsulating material for solar cell is measured under conditions of a measurement temperature range of 25° C. to 150° C., a frequency of 1.0 Hz, a rate of temperature increase of 10° C./minute, and a shear mode.

[B3] The encapsulating material for solar cell according to [B1] or [B2], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and measured under conditions of a temperature of 190° C. and a load of 2.16 kg, is in a range of 0.1 g/10 minutes to 7.0 g/10 minutes;

a3) a density, which is measured on the basis of ASTM D1505, is in a range of 0.865 g/cm$^3$ to 0.884 g/cm$^3$.

a4) a shore A hardness, which is measured on the basis of ASTM D2240, is in a range of 60 to 85.

[B4] The encapsulating material for solar cell according to [B3], in which the ethylene/α-olefin copolymer further satisfies the following requirement a2):

a2) MFR, which is based on ASTM D1238 and measured under conditions of a temperature of 190° C. and a load of 2.16 kg, is in a range of 0.1 g/10 minutes to less than 2.0 g/10 minutes.

[B5] The encapsulating material for solar cell according to any one of [B1] to [B4], in which a content of the organic peroxide in the encapsulating material for solar cell is in a range of 0.1 parts by weight to 3 parts by weight with respect to 100 parts by weight of the ethylene/α-olefin copolymer.

[B6] The encapsulating material for solar cell according to any one of [B1] to [B5], in which the encapsulating material has a sheet shape.

[B7] A encapsulating material for solar cell according to any one of [B1] to [B6], in which, in a long-term reliability test in which a crosslinked sheet obtained from a sheet-shaped encapsulating material for solar cell cut into sizes of a thickness of 0.5 mm, a length of 75 mm, and a width of 60 mm which has been depressurized for 3 minutes and heated for 10 minutes on a hot plate at 150° C. is left to stand in a constant temperature and humidity vessel having a temperature of 85° C. and a relative humidity of 85% for 2000 hours, when a yellow index of the crosslinked sheet before the long-term reliability test is represented by $YI_1$, and the yellow index of the crosslinked sheet after the long-term reliability test is represented by $YI_2$, a change ratio of the yellow index defined as $(YI_2-YI_1)$ is less than 2.

[B8] A solar cell module including:

a transparent surface protective member;

a back surface protective member;

a solar cell element; and an encapsulating layer which is formed by crosslinking the encapsulating material for solar cell according to any one of [B1] to [B7] and encapsulates the solar cell element between the transparent surface protective member and the back surface protective member.

[C1] An encapsulating material for solar cell including an ethylene/α-olefin copolymer, in which a complex viscosity of the encapsulating material for solar cell, which is measured through solid viscoelasticity measurement under conditions of a measurement temperature range of 25° C. to 150° C., a frequency of 1.0 Hz, a rate of temperature increase of 10° C./minute, and a shear mode, has a minimum value ($\eta^{*1}$) of the complex viscosity at a temperature in a range of 100° C. to lower than 135° C., the minimum value ($\eta^{*1}$) of the complex viscosity is in a range of $6.0 \times 10^3$ Pa·s to $4.0 \times 10^4$ Pa·s, and a complex viscosity ($\eta^{*2}$) of the encapsulating material for solar cell at 150° C. is in a range of $2.0\times10^4$ Pa·s to $1.0\times10^5$ Pa·s.

[C2] The encapsulating material for solar cell according to [C1], further including: an organic peroxide having a one-minute half-life temperature in a range of 100° C. to 170° C.

[C3] The encapsulating material for solar cell according to [C1] or [C2], in which a storage elastic modulus (G') of the encapsulating material for solar cell at 150° C., which is measured through solid viscoelasticity measurement under conditions of a measurement temperature range of 25° C. to 150° C., a frequency of 1.0 Hz, a rate of temperature increase of 10° C./minute, and a shear mode, is in a range of $1.0\times10^5$ Pa to $7.0\times10^5$ Pa.

[C4] The encapsulating material for solar cell according to any one of [C1] to [C3], in which the ethylene/α-olefin copolymer satisfies the following requirements a1) to a4):

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and measured under conditions of a temperature of 190° C. and a load of 2.16 kg, is in a range of 0.1 g/10 minutes to 7.0 g/10 minutes;

a3) a density, which is measured on the basis of ASTM D1505, is in a range of 0.865 g/cm³ to 0.884 g/cm³.

a4) a shore A hardness, which is measured on the basis of ASTM D2240, is in a range of 60 to 85.

[C5] The encapsulating material for solar cell according to [C4], in which the ethylene/α-olefin copolymer further satisfies the following requirement a2):

a2) MFR, which is based on ASTM D1238 and measured under conditions of a temperature of 190° C. and a load of 2.16 kg, is in a range of 0.1 g/10 minutes to less than 2.0 g/10 minutes.

[C6] The encapsulating material for solar cell according to [C2], in which a content of the organic peroxide in the encapsulating material for solar cell is in a range of 0.1 parts by weight to 3 parts by weight with respect to 100 parts by weight of the ethylene/α-olefin copolymer.

[C7] The encapsulating material for solar cell according to any one of [C1] to [C6], in which the encapsulating material has a sheet shape.

[C8] A encapsulating material for solar cell according to any one of [C1] to [C7], in which, in a long-term reliability test in which a crosslinked sheet obtained from a sheet-shaped encapsulating material for solar cell cut into sizes of a thickness of 0.5 mm, a length of 75 mm, and a width of 60 mm which has been depressurized for 3 minutes and heated for 10 minutes on a hot plate at 150° C. is left to stand in a constant temperature and humidity vessel having a temperature of 85° C. and a relative humidity of 85% for 2000 hours, when a yellow index of the crosslinked sheet before the long-term reliability test is represented by $YI_1$, and the yellow index of the crosslinked sheet after the long-term reliability test is represented by $YI_2$, a change ratio of the yellow index defined as ($YI_2-YI_1$) is less than 2.

[C9] A solar cell module including:
a transparent surface protective member;
a back surface protective member;
a solar cell element; and
an encapsulating layer which is formed by crosslinking the encapsulating material for solar cell according to any one of [C1] to [C8] and encapsulates the solar cell element between the transparent surface protective member and the back surface protective member.

The invention claimed is:

1. An encapsulating material for a solar cell comprising:
an ethylene/$C_{3-20}$ α-olefin copolymer; and
an organic peroxide having a one-minute half-life temperature in a range of 100° C. to 170° C.,
wherein a complex viscosity of the encapsulating material for the solar cell, which is measured through solid viscoelasticity measurement under conditions of a measurement temperature range of 25° C. to 150° C., a frequency of 1.0 Hz, a rate of temperature increase of 10° C./minute, and a shear mode, has a minimum value ($\eta^{*1}$) of the complex viscosity at a temperature in a range of 100° C. to lower than 135° C., said minimum value ($\eta^{*1}$) of the complex viscosity is in a range of $6.0\times10^3$ Pa·s to $1.9\times10^4$ Pa·s,
the complex viscosity ($\eta^{*2}$) of the encapsulating material for solar cell at the temperature of 150° C. is in a range of $5.2\times10^4$ Pa·s to $8.0\times10^4$ Pa·s, and
the content of the organic peroxide in the encapsulating material for the solar cell is in a range of 0.1 parts by weight to 3 parts by weight with respect to 100 parts by weight of the ethylene/$C_{3-20}$ α-olefin copolymer,
wherein the ethylene/$C_{3-20}$ α-olefin copolymer satisfies the following requirements a1) to a4):
a1) the content ratio of the structural unit derived from the ethylene is in a range of 80 mol % to 90 mol %, and the content ratio of the structural unit derived from the $C_{3-20}$ α-olefin having 3 to 20 carbon atoms is in a range of 10 mol % to 20 mol % (here, a sum of the structural unit derived from the ethylene and the structural unit derived from the $C_{3-20}$ α-olefin is 100 mol %);
a2) MFR, which is based on ASTM D1238 and measured under conditions of a temperature of 190° C. and a load of 2.16 kg, is in a range of equal to or more than 0.3 g/10 minutes and equal to or less than 1.8 g/10 minutes;
a3) a density, which is measured on the basis of ASTM D1505, is in a range of 0.865 g/cm³ to 0.884 g/cm³; and
a4) a shore A hardness, which is measured on the basis of ASTM D2240, is in a range of 60 to 85, and
wherein a storage elastic modulus (G') of the encapsulating material for the solar cell at a temperature of 150° C., which is measured through solid viscoelasticity measurement under conditions of a measurement temperature range of 25° C. to 150° C., a frequency of 1.0 Hz, a rate of temperature increase of 10° C./minute, and a shear mode, is in a range of $2.5\times10^5$ Pa to $7.0\times10^5$ Pa.

2. The encapsulating material for the solar cell according to claim 1,
wherein the encapsulating material has a sheet shape.

3. The encapsulating material for the solar cell according to claim 1,
wherein, in a long-term reliability test in which a crosslinked sheet obtained from a sheet-shaped encapsulating material for the solar cell cut into sizes of a thickness of 0.5 mm, a length of 75 mm, and a width of 60 mm which has been depressurized for 3 minutes and heated for 10 minutes on a hot plate at 150° C. is left to stand in a constant temperature and humidity vessel having a temperature of 85° C. and a relative humidity of 85% for 2000 hours,
when a yellow index of the crosslinked sheet before the long-term reliability test is represented by $YI_1$, and
the yellow index of the crosslinked sheet after the long-term reliability test is represented by $YI_2$, a change ratio of the yellow index defined as ($YI_2-YI_1$) is less than 2.

4. A solar cell module comprising:
a transparent surface protective member;
a back surface protective member;
a solar cell element; and
an encapsulating layer which is formed by crosslinking the encapsulating material for the solar cell according to claim 1 and encapsulates the solar cell element between the transparent surface protective member and the back surface protective member.

5. An encapsulating material for a back surface of a solar cell comprising:
an ethylene/$C_{3-20}$ α-olefin copolymer;
a colorant; and
an organic peroxide having a one-minute half-life temperature in a range of 100° C. to 170° C.,
wherein the encapsulating material is used on a non-light-receiving surface side,
the content of the organic peroxide in the encapsulating material for the back surface of the solar cell is in a range of 0.1 parts by weight to 3 parts by weight with respect to 100 parts by weight of the ethylene/$C_{3-20}$ α-olefin copolymer,
the content of the colorant in the encapsulating material for the back surface of the solar cell is in a range of 1 part by weight to 30 parts by weight with respect to 100 parts by weight of the ethylene/$C_{3-20}$ α-olefin copolymer, wherein
a minimum value ($\eta^{*3}$) of a complex viscosity of the encapsulating material for a back surface of the solar cell, which is measured through solid viscoelasticity measurement under conditions of a measurement temperature range of 25° C. to 180° C., a frequency of 0.016 Hz, a rate of temperature increase of 3° C./minute, and a shear mode, is in a range of $1.8\times10^4$ Pa·s to $2.0\times10^5$ Pa·s,
wherein said minimum value ($\eta^{*3}$) of the complex viscosity of the encapsulating material for the back surface of the solar cell, and a minimum value ($\eta^{*0}$) of a complex viscosity of the encapsulating material for a front surface of the solar cell, which is measured under the same conditions as said minimum value ($\eta^{*3}$) of the complex viscosity of the encapsulating material for the back surface of the solar cell, satisfy the following relationship:

$-0.02 \leq \mathrm{Log}(\eta^{*3}/\eta^{*0}) < 3.0$, wherein the ethylene/$C_{3-20}$ α-olefin copolymer satisfies the following requirements a1) to a4):
a1) the content ratio of the structural unit derived from the ethylene is in a range of 80 mol % to 90 mol %, and the content ratio of the structural unit derived from the $C_{3-20}$ α-olefin having 3 to 20 carbon atoms is in a range of 10 mol % to 20 mol % (here, a sum of the structural unit derived from the ethylene and the structural unit derived from the $C_{3-20}$ α-olefin is 100 mol %)
a2) MFR, which is based on ASTM D1238 and measured under conditions of a temperature of 190° C. and a load of 2.16 kg, is in a range of equal to or more than 0.3 g/10 minutes and equal to or less than 1.8 g/10 minutes,
a3) a density, which is measured on the basis of ASTM D1505, is in a range of 0.865 g/cm³ to 0.884 g/cm³; and
a4) a shore A hardness, which is measured on the basis of ASTM D2240, is in a range of 60 to 85, and
wherein the colorant includes an inorganic filler,
the inorganic filler includes an acidic compound, and
the content of the acidic compound in the encapsulating material for the back surface of the solar cell is equal to or less than 8 weight ppm.

6. The encapsulating material for the back surface of the solar cell according to claim 5,
wherein the inorganic filler is at least one selected from the group consisting of natural mica, synthetic mica, titanium oxide, aluminum oxide, calcium carbonate, talc, clay, magnesium carbonate, kaolinite, and diatomite.

7. A solar cell module comprising:
a transparent surface protective member;
a back surface protective member;
a solar cell element; and
an encapsulating layer that encapsulates the solar cell element between the transparent surface protective member and the back surface protective member,
wherein the encapsulating layer is formed by heating and pressing the encapsulating material for the back surface of the solar cell according to claim 5 and an encapsulating material for a front surface of the solar cell.

\* \* \* \* \*